US009064994B2

(12) United States Patent
Shelby et al.

(10) Patent No.: US 9,064,994 B2
(45) Date of Patent: Jun. 23, 2015

(54) SELF-CORRUGATING LAMINATES USEFUL IN THE MANUFACTURE OF THERMOELECTRIC DEVICES AND CORRUGATED STRUCTURES THEREFROM

(71) Applicant: Eastman Chemical Company, Kingsport, TN (US)

(72) Inventors: Marcus David Shelby, Fall Branch, TN (US); David B. Calvert, Kingsport, TN (US); Freddie Wayne Williams, Kingsport, TN (US); Scott Allen Clear, Escondido, CA (US); Peter Borden Mackenzie, Kingsport, TN (US); Candace Michele Tanner, Kingsport, TN (US); Jennifer Lynne Stikeleather-Peavey, Raleigh, NC (US); Jeffrey Todd Owens, Kingsport, TN (US)

(73) Assignee: Eastman Chemical Company, Kingsport, TN (US)

( * ) Notice: Subject to any disclaimer, the term of this patent is extended or adjusted under 35 U.S.C. 154(b) by 13 days.

(21) Appl. No.: 14/182,513

(22) Filed: Feb. 18, 2014

(65) Prior Publication Data

US 2014/0318591 A1    Oct. 30, 2014

Related U.S. Application Data

(60) Provisional application No. 61/816,234, filed on Apr. 26, 2013.

(51) Int. Cl.
*H01L 35/28* (2006.01)
*H01L 35/04* (2006.01)
(Continued)

(52) U.S. Cl.
CPC ............... *H01L 35/04* (2013.01); *B29C 61/02* (2013.01); *H01L 35/34* (2013.01); *B32B 3/28* (2013.01); *F25B 21/02* (2013.01); *H01L 35/30* (2013.01); *H01L 35/32* (2013.01)

(58) Field of Classification Search
None
See application file for complete search history.

(56) References Cited

U.S. PATENT DOCUMENTS

| 2,607,104 A | 8/1952 | Foster |
| 3,574,109 A | 4/1971 | Yoshikawa |

(Continued)

FOREIGN PATENT DOCUMENTS

| EP | 0 213 957 A2 | 3/1987 |
| EP | 0 818 305 A2 | 1/1998 |

(Continued)

OTHER PUBLICATIONS

Co-pending U.S. Appl. No. 13/965,288, filed Aug. 13, 2013, Shelby et al.

(Continued)

*Primary Examiner* — Eli Mekhlin
(74) *Attorney, Agent, or Firm* — John P. Foryt

(57) ABSTRACT

Self-corrugating laminates useful in the manufacture of thermoelectric devices are disclosed. The laminates include an upper and a lower shrinkable film layer and a non-shrinkable core with a thermoelectric pattern formed thereon bonded between said upper and lower shrinkable film along bond lines arranged parallel, substantially parallel, radially, or annularly. The bond lines that bond the upper shrinkable film layer to top surface of the nonshrinkable core are staggered relative to the bond lines that bond the lower shrinkable film layer to the bottom surface of the non-shrinkable core such that upon shrinkage of the shrinkable film layers, structural corrugations are formed in the non-shrinkable core. Thermoelectric modules or devices and methods for forming them from the self-corrugating laminates are also described.

12 Claims, 11 Drawing Sheets

(51) Int. Cl.
  *B29C 61/02* (2006.01)
  *H01L 35/34* (2006.01)
  *B32B 3/28* (2006.01)
  *F25B 21/02* (2006.01)
  *H01L 35/30* (2006.01)
  *H01L 35/32* (2006.01)

(56) References Cited

U.S. PATENT DOCUMENTS

| | | |
|---|---|---|
| 3,620,896 A | 11/1971 | Glasgow |
| 3,655,502 A | 4/1972 | Yoshikawa |
| 3,694,995 A | 10/1972 | McKinney |
| 3,796,307 A | 3/1974 | McKinney |
| 3,900,356 A | 8/1975 | Koch et al. |
| 4,065,936 A | 1/1978 | Fenton et al. |
| 4,267,223 A | 5/1981 | Swartz |
| 4,859,250 A | 8/1989 | Buist |
| 5,226,298 A * | 7/1993 | Yamamoto et al. ............ 62/3.4 |
| 5,256,467 A | 10/1993 | Kato |
| 5,515,238 A | 5/1996 | Fritz et al. |
| 6,039,101 A | 3/2000 | MacKinnon |
| 6,314,741 B1 | 11/2001 | Hiraishi |
| 6,875,712 B2 | 4/2005 | Todt |
| 7,588,818 B2 | 9/2009 | Zafiroglu et al. |
| 7,851,691 B2 | 12/2010 | DeSteese et al. |
| 7,901,758 B2 | 3/2011 | Rasmussen |
| 8,378,205 B2 | 2/2013 | Sienel |
| 8,378,206 B2 | 2/2013 | Schuette et al. |
| 8,487,177 B2 | 7/2013 | Pingree et al. |
| 2006/0278265 A1 | 12/2006 | Ouwerkerk et al. |
| 2009/0258191 A1* | 10/2009 | Peacock ........................ 428/167 |

FOREIGN PATENT DOCUMENTS

| | | |
|---|---|---|
| EP | 1 906 463 A2 | 4/2008 |
| JP | 06-115014 A | 4/1994 |
| JP | 06-238796 A | 8/1994 |
| JP | 06-238800 A | 8/1994 |
| JP | 2004-281666 A | 10/2004 |
| JP | 2005-144663 A | 6/2005 |
| JP | 2008-130813 A | 6/2008 |
| WO | WO 96/38296 A1 | 12/1996 |
| WO | WO 2009/079579 A1 | 6/2009 |
| WO | WO 2009/121011 A2 | 10/2009 |
| WO | WO 2013/114854 A1 | 8/2013 |
| WO | WO 2014/052358 A1 | 4/2014 |

OTHER PUBLICATIONS

Co-pending U.S. Appl. No. 14/025,059, filed Sep. 12, 2013, Shelby et al.
Co-pending U.S. Appl. No. 14/032,577, filed Sep. 20, 2013, Shelby et al.
ASTM D882—12; "Standard Test Method for Tensile Properties of Thin Plastic Sheeting".
Notification of Transmittal of the International Search Report with Mail Date of Dec. 5, 2013 for International Application No. PCT/US2013/061540.
Notification of Transmittal of the International Search Report with Mail Date of Dec. 5, 2013 for International Application No. PCT/US2013/061536.
Notification of Transmittal of the International Search Report with Mail Date of Dec. 5, 2013 for International Application No. PCT/US2013/061542.
USPTO Office Action dated Jan. 30, 2015 for co-pending U.S. Appl. No. 14/032,577.
USPTO Office Action dated Mar. 12, 2015 for co-pending U.S. Appl. No. 14/025,059.
Notification of Transmittal of the International Search Report with Mail Date of Jul. 28, 2014 for International Application No. PCT/US2014/034278.

* cited by examiner

SELF-CORRUGATING LAMINATES USEFUL IN THE MANUFACTURE OF THERMOELECTRIC DEVICES AND CORRUGATED STRUCTURES THEREFROM

CROSS REFERENCE TO RELATED APPLICATIONS

This application claims the benefit of U.S. Provisional Application No. 61/816,234 filed Apr. 26, 2013, the entirety of which is hereby incorporated by reference.

FIELD OF THE INVENTION

The present invention relates to laminate films, and specifically, to self-corrugating laminates that are useful in the manufacture of thermoelectric devices.

BACKGROUND OF THE INVENTION

The ability to make structural or functional plastic panels is limited to just a few processes because of the low modulus of plastics in general, coupled with the difficulty of generating three-dimensionally-reinforced structures. The processes that are available are either labor-intensive (e.g. thermoforming and bonding) or require extensive tooling (e.g. twin wall sheet extrusion). Parts made by these methods are also typically limited to two-dimensions such as with panels and, once produced, tend to be bulky and cannot be easily shipped or packaged. It is also difficult to introduce functionality into these structures because the core material is not easily modified, being specific to the intended use. It would be an advance in the art to provide rigid, and optionally functional, structural panels that are easily produced and shipped, that may be formed as films and shipped as rolls, and that may then be expanded just prior to use to form structural and/or functional corrugates. Although prior art constructions are known in which shrinkable layers assist in forming corrugations, we have found conventional shrinkable materials unsuitable to more demanding applications in which regular, structural corrugations are required.

For example, U.S. Pat. No. 2,607,104 discloses two-ply and three-ply woven corrugated fabrics that are said to be highly resilient in resisting lateral compression. The three-ply fabrics include a top and bottom fabric that can be shrunk or contracted in one direction to a pronounced degree of about 50% when heated, so that the shrinking of the outer fabrics will corrugate the intermediate fabric.

U.S. Pat. No. 3,620,896 discloses a tape having at least two laminae of different coefficients of contraction joined to prevent interlamina relative movement during contraction. The contractable lamina, which may contract as much as 50 to 70 percent of its original stretched dimensions upon activation, is said to be sharply corrugated, resulting in a lack of structural rigidity needed for more demanding applications. The tapes disclosed are intended simply as devices for securing wire and cable bundles, and the like.

U.S. Pat. Nos. 3,574,109 and 3,655,502 disclose heat insulating laminates in which at least one metal foil and at least one thermoplastic resin film are bonded at a number of bonding points uniformly distributed throughout the surface. The material is heated to cause shrinkage of the resin film and wrinkling of the metal foil.

U.S. Pat. No. 3,796,307 discloses a corrugated package material in which corrugated fluting is attached to one or more sheets of heat shrinkable polymeric film. The heat shrinkable film is preferably on only one side of the corrugated fluting, but may be on both sides of the corrugated fluting. The package may be heated to shrink the polymeric film and tighten the corrugated fluting core.

U.S. Pat. No. 6,875,712 discloses a shrinkable protective material that includes a nonwoven fabric bonded to a shrinkable film by an adhesive that is applied to either the nonwoven fabric or the shrinkable film in a pre-determined pattern. Upon shrinking, the nonwoven fabric separates or releases from the film and forms cushions or pillows holding the film off of the surface being protected.

U.S. Pat. No. 7,588,818 discloses a multi-layer composite sheet comprising a shrinkable layer intermittently bonded to a gatherable layer with the bonds separated by a specified distance, wherein the shrinkable layer can shrink and at the same time gather the gatherable layer between the bonds. Also disclosed is a process for preparing multi-layer composite sheets by intermittently bonding a shrinkable layer to a gatherable layer with the bonds separated by a specified distance and causing the shrinkable layer to shrink while at the same time gathering the gatherable layer between the bonds.

JP 6-115014A discloses a laminatable strip that has self-stretching properties and can be filled with gas on site without the use of an expanding gas or the like, wherein the strip is a highly self-stretchable strip that has an ultrahigh gas content and a stable structure after stretching.

JP 6-238800A discloses a laminate for forming a three-dimensional structure with holes wherein a low-heat-shrinkage sheet and a high-heat-shrinkage sheet are alternately laminated together via partially adhesive layers arranged at a pre-determined interval in a substantially striped pattern substantially perpendicular to the shrinkage direction of the high-heat-shrinkage sheet, the laminate being characterized in that the low-heat-shrinkage sheet and the high-heat-shrinkage sheet are laminated in at least five layers or more. Working Example 1 uses a 100 um paper core and a 40 um PVC shrink film exhibiting 50% shrink, with a 30 mm bond spacing. The resulting "corrugation ratio" based on literature values for PVC and paper, as further discussed below, is estimated to be about 0.014. We have found that values that give the best performance are between 0.02 and 0.9 based on our experiments. Being on the low side of this range means the shrink force is too high relative to the buckling resistance of the core such that overbuckling/wrinkling typically occurs.

A related patent document having the same inventor and filing date, JP 6238796, discloses a three-dimensional arcuately formed laminated body, said to be useful for obtaining a strong and stable three-dimensional structure, that is made from a low-heat-shrinking sheet and a high-heat-shrinking sheet alternatingly laminated such that there exists a difference in shrinkage between the sheets in the vertical direction, the sheets being interposed by a plurality of substantially striped partial adhesive layers disposed at a specific spacing. The laminated body is characterized in that the low-heat-shrinking sheet and the high-heat-shrinking sheet are five or more layers in total, and the partial adhesive layers are disposed alternatingly on an obverse and reverse side of the low-heat-shrinking sheet such that the spacing sequentially increases or decreases.

Multilayer structures with a nonplanar component are generally well known for use in a wide variety of end-use applications. U.S. Pat. No. 4,859,250 discloses a thermoelectric heat pump or power source device that includes a flexible substrate on which thermocouples of P-type and N-type thermoelectric film type elements are formed and which are folded to combine all cold strips on a first plane and all hot strips on a second plane opposing the first plane.

There remains a need in the art for improved laminates that are easily produced and shipped, that may be formed as films and shipped as rolls, and that may then be expanded just prior to use to form thermoelectric devices or modules.

SUMMARY OF THE INVENTION

The invention thus relates to self-corrugating laminates and more particularly to self-corrugating laminates that are useful in the manufacture of thermoelectric devices or modules. In one aspect, the self-corrugating laminates include an upper and a lower shrinkable film layer each having at least one axis of shrinkage and a non-shrinkable core bonded between the upper and lower shrinkable film layers along bond lines arranged parallel, substantially parallel, radially, or annularly. The bond lines that bond the upper shrinkable film layer to the top surface of the non-shrinkable core are staggered relative to the bond lines that bond the lower shrinkable film layer to the bottom surface of the non-shrinkable core such that upon shrinkage of the shrinkable film layers, structural corrugations are formed in the non-shrinkable core. At least a portion of the bond lines are arranged substantially perpendicular to an axis of shrinkage of the shrinkable film layer to which the bond lines are attached. The non-shrinkable core has a thermoelectric pattern on at least one of its top surface and bottom surface. The shrinkable film layers of the invention typically exhibit a percent shrinkage along an axis of shrinkage from about 10 to about 45 percent. Alternatively, the shrinkable film layers may exhibit a percent shrinkage, for example, from 15 to 35 percent or from 20 to 30 percent, or as disclosed elsewhere herein.

In one aspect, the difference in shrinkage percent between the upper and lower shrinkable film layers is no more than 10%. In another aspect, the difference in shrinkage percent between the upper and lower shrinkable film layers is at least 10%, such that the resulting structure upon shrinkage of the shrinkable film layers is substantially curved, as further described below.

In one aspect, the self-corrugating laminates of the invention exhibit a corrugation ratio from 0.02 to 0.9, upon shrinkage of the shrinkable film layers, according to the following formula 2:

$$0.02 < \frac{1}{3} * \frac{\pi^2 E_c h_c^3}{P_o^2 \sigma h_s} < 0.9 \quad (2)$$

wherein hc is the non-shrinkable film layer thickness, Ec is the modulus of the non-shrinkable film layer, Po is the spacing between adhesive bond lines, a is the shrinkage stress upon shrinkage of the shrinkable film layers, and hs is the thickness of the shrinkable film layers. Alternatively, the corrugation ratio may be from 0.05 to 0.8, or from 0.1 to 0.75, or as further described herein.

In a further aspect, the laminates of the invention exhibit an aspect ratio, upon shrinkage of the shrinkable film layers, from about 0.1 to about 0.8, according to the following formula 3:

$$0.1 < Hc/P < 0.8 \quad (3)$$

wherein Hc is the height of the corrugated core and P is the line bond spacing after shrinkage. Alternatively, the aspect ratio may be from 0.2 to 0.6, or as disclosed elsewhere herein.

Bond lines of the self-corrugating laminates of the invention may be formed in a number of ways, and may thus comprise an adhesive, conductive adhesive, a heat-weld, or a solvent-weld, for example. The self-corrugating laminates of the invention may include a non-shrinkable film layer provided with one or more flutes to assist in corrugating the non-shrinkable film layer upon shrinkage of the shrinkable film layers.

In one aspect, the self-corrugating laminates of the invention have a thickness of the resulting structure, H, upon shrinkage of the shrinkable film layers, that differs within the structure due to differences in the bond line spacing P, the ratio of the maximum value of P to the minimum value of P within the resulting structure being 1.1 or greater, or 1.2 or greater, or 1.5 or greater, or as disclosed elsewhere herein.

In one aspect, as further described herein, the self-corrugating laminates of the invention have a non-shrinkable core film layer that is formed from two non-shrinkable film layers adhered to one another, each of which layers has a shrinkable film layer bonded thereto using bond lines.

Further aspects of the invention are as disclosed and claimed herein.

DETAILED DESCRIPTION

Figure 1:
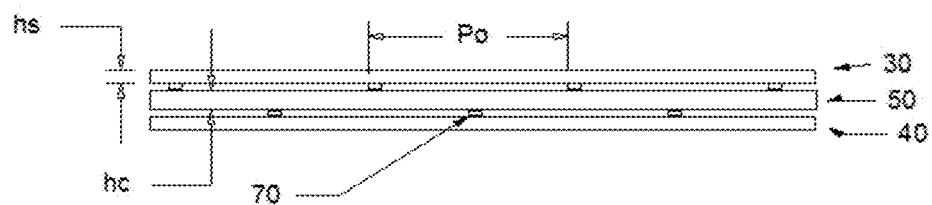
FIG. 1 depicts a cross-section of a 3-layer A/B/A configuration for a self-corrugating laminate of the invention (not to scale).

Attention is directed to FIG. 1 of the drawings, which depicts the cross-section of a typical 3-Layer A/B/A structure of a self-corrugating film laminate of one embodiment of the invention prior to corrugation (not shown to scale). Shrinkage is generally in the horizontal direction as depicted and substantially perpendicular to the bond lines 70. This shrinkage direction is described herein as the axis or axes of shrinkage. In one aspect, the invention thus relates to a self-corrugating flat laminate film structure, as depicted in FIG. 1, having three layers: a non-shrinkable core 50 sandwiched between and bonded to first (or upper) and second (or lower) shrinkable film layers 30 and 40. The shrinkable film layers have a thickness, hs, whereas the non-shrinkable film or core has a thickness equal to hc. Each of the shrinkable film layers is bonded to the non-shrinkable core along bond lines 70 spaced with a periodic spacing Po, using for example adhesive or thermal type bonding. Furthermore, the bond lines 70 bonding the shrinkable film layer 30 to the non-shrinkable core 50 are typically staggered relative to the bond lines 70 bonding the shrinkable film layer 40 to the non-shrinkable core 50 by a distance of approximately Po/2.

Figure 2:
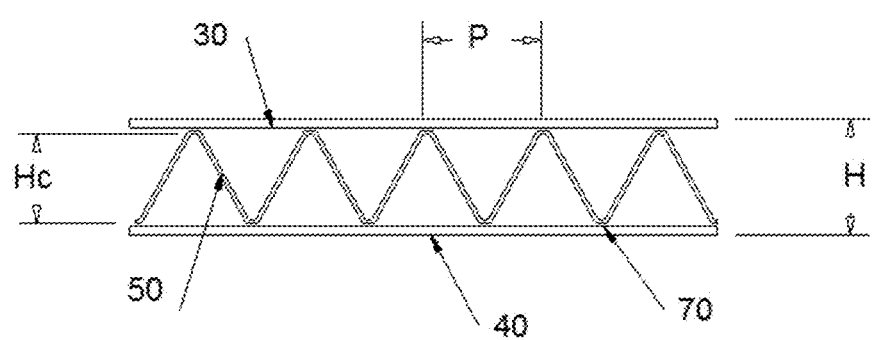
FIG. 2 depicts a cross-section of an A/B/A corrugated structure made from a laminate according to the invention.
Figure 3:
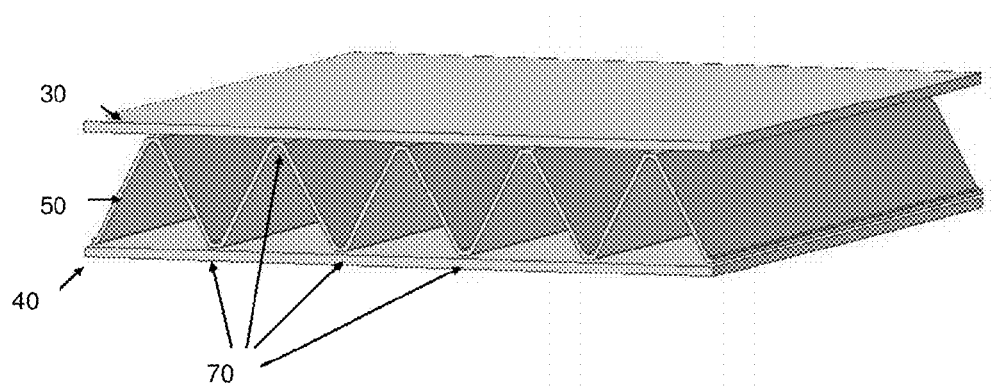
FIG. 3 depicts a three-dimensional representation of a corrugated structure made from a laminate according to the invention (Uniaxial Form)

Attention is directed now to FIG. 2, which depicts a cross-section of an A/B/A Corrugated Structure, and to FIG. 3, which depicts a three-dimensional representation of a corrugated structure of the invention in uniaxial form. According to the invention, the staggering of bond lines 70 as described above helps drive the formation of the structural corrugations (see FIGS. 2 and 3) by pulling adjacent portions of the core in different directions via contraction force imparted by shrinking of the shrinkable film layers. The final structure may have, for example, a new periodic spacing equal to, for example, P (P<Po), a total height equal to H and a height of corrugation equal to Hc. As further described herein, the initial bond spacing Po is selected based on the geometry of the films during shrinkage of the shrinkable film layers in order to obtain structural corrugations without excessive wrinkling.

In one aspect, the invention thus relates to self-corrugating laminates that include upper and lower shrinkable film layers and a non-shrinkable core between said upper and lower shrinkable film layers and discontinuously bonded to each of the shrinkable film layers along bond lines. The self-corrugating laminates may optionally comprise repeating layers of a shrinkable film layer and a non-shrinkable film layer, each of which is discontinuously bonded to the adjacent film layer, for example with a shrinkable film layer as the top layer of the laminate, and another shrinkable film layer as the bottom layer of the laminate. Upon heating or otherwise causing the shrinkable film layers to shrink, the non-shrinkable film layer is thereby formed into regular corrugations that provide structural support, described herein as structural corrugations. The laminates described may be used, for example, to form structural corrugate articles or three-dimensional structural corrugate articles having, for example, a honeycomb form.

In another aspect, a functional, non-shrinkable film or core is bonded intermittently between two shrinkable film layers in a staggered or discontinuous fashion using bond lines. Upon shrinking, for example by heating heat-shrinkable film layers, the shrinkable film layers of the invention pull the structure into a three-dimensional corrugated structure. The resulting structure can be used for a wide variety of applications (e.g. structural or thermal, etc.) based on the form of the functional core or non-shrinkable film, layer. Curved structures are also possible by controlling the relative layer shrinkage and bond line spacing.

Unless otherwise indicated, all numbers expressing quantities of ingredients, properties such as percent shrinkage, corrugation ratio, and so forth used in the specification and claims are to be understood as being modified in all instances by the term "about." Accordingly, unless indicated to the contrary, the numerical parameters set forth in the specification and claims are approximations that may vary depending upon the desired properties sought to be obtained by the present invention. At the very least, each numerical parameter should at least be construed in light of the number of reported significant digits and by applying ordinary rounding techniques. Further, the ranges stated in this disclosure and the claims are intended to include the entire range specifically and not just the endpoint(s). For example, a range stated to be 0 to 10 is intended to disclose all whole numbers between 0 and 10 such as, for example 1, 2, 3, 4, etc., all fractional numbers between 0 and 10, for example 1.5, 2.3, 4.57, 6.1113, etc., and the endpoints 0 and 10. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements.

As used herein, the term "shrinkable film layer" means a film layer that is capable of shrinking upon exposure to, treatment with or removal of a given condition or stimulus, for example elevated temperature or radiation (heat shrinking) or moisture (moisture induced shrinking) or force (release of a tensional force holding an elastomeric material in a stretched condition). The term is not intended to be especially limiting, although we have found, as further described below, that a surprisingly small amount of shrinkage yields excellent results in terms of uniformity of the structural corrugations obtained. As further set out below, the shrinkage may be substantially uniaxial, or may be biaxial, or may vary throughout the surface of the film layer, such variation being matched to corresponding variations in the placement of the bond lines used to bond the shrinkable film layers to the non-shrinkable film layer. The bond lines will typically be placed substantially perpendicular to an axis of shrinkage of the shrinkable film layer, as further described herein. Any suitable film capable of shrinking, for example heat shrinkable film, may be used according to the invention, as further described herein.

As used herein, the term "non-shrinkable core" is not intended to exclude substrates that shrink, but rather, to describe substrates that shrink, if at all, substantially less than do the shrinkable film layers. In some embodiments, the non-shrinkable core layer may not shrink appreciably during use, while in others the non-shrinkable core may shrink to some extent, either uniformly or to correspond to a desired final shape which is obtained in combination with the appropriate spacing and placement of bond lines. In various aspects, the amount of linear shrinkage of the non-shrinkable core may be less than about 10%, or less than 5%, or less than 1%, or as further set out herein. It should be evident that the non-shrinkable film layer will shrink substantially less than at least one of the adjacent shrinkable film layers so that the desired structural corrugations may be formed.

As used herein, the term "upper shrinkable film layer" means generally an outer shrinkable film layer which is opposite a lower shrinkable film layer, with a non-shrinkable film layer bonded between the upper and lower shrinkable film layers, or with alternating layers of non-shrinkable and shrinkable film layers therebetween. It will be appreciated that typically each shrinkable film layer will be bonded to at least one non-shrinkable film layer, and that each non-shrinkable film layer will be bonded to at least one and typically two shrinkable film layers. Further aspects of the laminates of the invention are further set out below.

As used herein, the term "lower shrinkable film layer" means generally an outer shrinkable film layer which is opposite the upper shrinkable film layer, with a non-shrinkable core bonded between said upper and lower shrinkable film layers, or with alternating layers of non-shrinkable core and shrinkable film layers therebetween.

As used herein, the term "bond lines" means continuous or discontinuous bonding which is generally linear or curved, and may be a continuous line or a noncontinuous line, for example a line or curve comprised of spot welding, arranged with respect to adjacent bond lines either parallel, substantially parallel, radially, or annularly. By the use of the term "bond lines" we do not mean that the non-shrinkable film must be bonded along a continuous line, but can instead be "spot-welded" to the shrinkable layers, so long as the bonding is generally linear or curved, as just described. Spot welds are acceptable, but they preferably are reasonably close together so that distortion does not occur upon shrinkage of the shrinkable film layers.

It will be evident that the bond lines generally will be substantially perpendicular to an intended shrinkage direction or axis of shrinkage, so that the bond lines will thereby form structural corrugates of the non-shrinkable film layer as the shrinkable film layer(s) shrink.

When we describe the resulting structure upon shrinkage of the shrinkable film layers, we mean the structural corrugations or structural corrugates that result during or after the shrinkable film layers have shrunk, as the case may be, thus forming the structural corrugations.

As used herein, the term "structural corrugations" or "structural corrugates" means corrugations formed in the non-shrinkable core due to the shrinking of the shrinkable film layers which draws the non-shrinkable core into corrugations. Preferably, these corrugations are sufficient to add structural integrity and/or load-bearing, structural support to the overall structure and are to be distinguished from weak and typically irregular and/or wavy lines that may be suitable, for example, to provide an insulating layer or bulk in cases where structural support is not required, and the corrugations need not therefore be carefully controlled as is done according to the present invention. Although the prior art has in some cases depicted in idealized drawings corrugations that appear to be regular and substantial, and thus useful to provide structural support, we have found that such disclosures are deficient in disclosing how such a regular pattern with sufficient structural support could be obtained. This discussion of corrugations is further elaborated on below with respect to, among other things, to the aspect ratio (Hc/P).

When we say that shrinkage is "substantially perpendicular" to the bond lines or that the bond lines are "substantially perpendicular" to the axis of shrinkage, we mean that the bond lines and the axis of shrinkage are sufficiently perpendicular to one another in a given area of the laminate so as to obtain the desired shape in the resulting corrugated structure. It will be understood that the axis of shrinkage is the general direction in which the length of the shrinkable film layer changes during shrinkage.

Thus, if the shrinkable film layer is substantially uniaxial, at least a portion and preferably a substantial portion of the bond lines will be placed substantially perpendicular to the axis of shrinkage. If a shrinkable film layer is biaxial or polyaxial, in which a given area of a shrinkable film layer changes length upon shrinkage in more than one axial direction, both or all of the axial directions of shrinkage will be taken into account in placing the bond lines. See, for example, the embodiment of the invention set out in FIG. 6 in which bond lines are arranged annularly to obtain a bowl-like shape. Those skilled in the art in light of the present disclosure will be able to determine where to place the bond lines given the nature of the shrinkable film layer selected and the shape that is desired to be obtained.

According to one aspect of the invention, an unexpected discovery was the importance of providing a relatively low amount of shrinkage in the shrinkable film layers in order to obtain uniform structural corrugations. Shrinkage, in this case, is defined as the percentage of length lost for example upon heating, using the following formula:

$$\text{Percent shrinkage} = (Lo - L)/Lo * 100 \qquad (1)$$

wherein L is the length of the film after shrinkage, and Lo is the length prior to shrinkage. Shrinkage refers to the amount of shrinkage obtainable in a single direction and may be measured in heat-shrinkable film by heating the film to a temperature sufficiently above the Tg (or Tm) to allow substantially complete recovery of the film. By the term "length," we mean generally the machine direction in which, for example, a heat-shrinkable film layer was formed, although such a film may be stretched radially, for example, and the bond lines associated with the film laid out in a corresponding fashion substantially perpendicular to the direction in which the film is stretched. See generally FIG. 6. The length may thus be in the shrinkage direction of axis of shrinkage for uniaxial film and either or both directions when biaxial film layers are described. Thus, when round or rounded structures are desired, the intended shrinkage may be radial. Note that for biaxial films we will typically have bond lines perpendicular to one shrinkage direction, but not necessarily the other, due to the nature of such radial shrinkage.

Although most commercial shrink films used for packaging have an ultimate or total shrinkage of 60 to 80%, we have found that the high shrinkage from these conventional films produces poorly formed and uncontrolled corrugations (i.e. "wrinkling" or "overbuckling") and thus was not acceptable. As a result of much experimentation and analysis, it was discovered that a defined range of shrinkage would produce uniformly corrugated structures, for example a percent shrinkage in the range, of about 8% to about 48%, or 10 to 45%, or 15 to 35%, or 20 to 30%. The percent shrinkage may thus be, for example, at least about 8%, or at least 10%, or at least 15%, or at least 20%, up to 30% or 35% or 40%, or 45%. Outside of these ranges, either wrinkling or insufficient buckling may occur, such that it is difficult to create stable and consistent structural corrugations. Even in cases where we were able to achieve acceptable structures using high shrinkage shrinkable film layers, by only partially shrinking the shrinkable film layers, the resulting structures were not thermally stable as any additional heating would cause the corrugation to be disrupted.

We note that the shrinkable layers need not all exhibit the same percentage of shrinking, especially if curved structures are desired. For example, one shrinkable film layer discontinuously bonded to a non-shrinkable film layer may have about 10% shrinkage, while the other shrinkable film layer attached to the non-shrinkable film layer may exhibit about a 20% shrinkage, causing the non-shrinkable film layer to corrugate, while the overall structure of the structural corrugate is caused to form a curve due to the difference in percent shrinkage of the two shrinkable film layers. See, for example, FIG. 4. In such cases, differential shrinkage is an important aspect of obtaining curved structures. The difference in shrinkage between the layers can thus be used to control the radius of curvature.

Shrink Stress

According to another aspect of the invention, the appropriate shrink stress is selected so as to cause the core to buckle into the desired structural corrugations. "Shrink stress" is the maximum retraction force exhibited by the film when heated divided by the initial cross-sectional area of the film.

For a given material, shrink stress increases with shrinkage, and predictive models for this relationship already exist (e.g. Mooney-Rivlin and neo-Hookian models). This lower shrink stress, however, produces a paradox. Higher shrink force is needed to achieve uniform buckling; however, higher shrinkage may cause "overbuckling" and poorly defined corrugation. Finding the right balance between these competing factors was therefore a significant aspect of the invention according to this embodiment.

According to this aspect of the invention, a balance is achieved between the buckling resistance of the non-shrinkable core film layer and the amount of shrink force being applied by the shrinkable film layers. The core buckling resistance is a function of the core thickness hc, the modulus of the core Ec, and the spacing between adhesive bonds Po. The shrinkage force, in turn, is a function of the shrinkage stress a and the thickness of the shrinkable film layers hs. Note that shrink stress is a property of the shrinkable film layers and is dependent on both the material and the stretching conditions used to make the shrinkable film layers. For example, very high shrinkage film will usually have very high shrink stress (think of the force of a rubber band when stretched). Shrink stress is typically constant for a given roll of film and most commercial shrink films have fairly well-defined values. The shrink force, on the other hand, is equal to the shrink stress multiplied by the cross sectional area of the film (i.e. thickness×width). So for films with lower shrink stress (e.g. low shrinkage films like those described herein), we may compensate by using thicker films to keep the shrink force high enough. Sufficiently high shrink force is needed or the structure may not corrugate.

Thus, in view of the foregoing, we found that the following dimensionless "corrugation ratio" may be desired in order to achieve consistent buckling or corrugating:

$$\frac{1}{3} * \frac{\pi^2 E_c h_c^3}{P_o^2 \sigma h_s} < 1 \qquad (2)$$

According to this aspect of the invention, if the above relationship between layer thicknesses, bond spacing, core modulus and shrink stress is met, then there exists the appropriate shrink force to induce satisfactory buckling.

Thus, in one aspect, the corrugation ratio according to the following formula may be from 0.02 to 0.9 according to the following formula:

$$0.02 < \frac{1}{3} * \frac{\pi^2 E_c h_c^3}{P_o^2 \sigma h_s} < 0.9 \qquad (3)$$

with the lower value ensuring that the shrink force is not too large. We have observed that if the corrugation ratio is below about 0.02, the forces are too high relative to the buckling strength of the core and poor uniformity results. Alternatively, the corrugation ratio may be from 0.05 to 0.8, or from 0.1 to 0.75.

If the above conditions with respect to the corrugation ratio are met, uniform and strong corrugated structures may be created having a substantially sinusoidal aspect ratio. The aspect ratio, in this case, is the ratio Hc/P where Hc is the height of the corrugated core and P is the line bond spacing after shrinkage (i.e. Hc is twice the amplitude of the sine wave represented by the corrugation and P is the corrugation wavelength). If Hc/P is too large, then the resulting corrugation is very "tall" and closely packed together resulting in a more unstable structure. In this case, compressive strength (i.e. top load) is adequate but shear resistance is poor. Similarly, if Hc/P is too low, the corrugation is too shallow and widely spaced and provides little compressive strength from top loads (but good shear resistance).

For the present invention, it is preferred that for the corrugated structure the aspect ratio be from about 0.1 to about 0.8 according to the following formula:

$$0.1 < Hc/P < 0.8 \qquad (4)$$

Alternatively, the range may be from 0.2 to 0.6, as this reflects the corrugation structure for a desirable range of shrinkages from about 15% to about 35%.

According to the invention, the bond lines that bond the non-shrinkable core to the adjacent shrinkable film layers may be arranged with respect to one another either parallel or substantially parallel, or radially or annularly from a given point, depending upon the desired shape of the final structure once shrinkage has occurred. Thus, in one aspect, the present invention comprises a substantially flat film/sheet structure having three layers including an inner core or non-shrinkable film layer sandwiched between two shrinkable cap layers or film layers, as depicted in FIG. 1. Each of the shrinkable film layers is bonded to the adjacent non-shrinkable or core linearly, using bond lines laid out, for example, parallel, substantially parallel, radially, or annularly, with a periodic spacing of approximately Po, using, for example, an adhesive, solvent welding, or thermal-type bonding. Furthermore, the bonding of the top or upper shrinkable film layer is staggered relative to the bottom or lower shrinkable film layer by approximately Po/2. This staggered bonding helps to drive the formation of the corrugated structures as depicted for example in FIGS. 2 and 3, by alternately pulling portions of the core non-shrinkable film layer in different directions.

The present invention thus provides a way to make corrugated panels using sheet stock or film. Curvature of the panels may be provided by controlling the relative shrinkage of the shrinkable film layers and placement of bond lines. Furthermore, in some aspects of the invention the structure can be rolled while in flat form for ease of shipping, with formation of the bulkier corrugation performed only when needed. Because the non-shrinkable film or core may be selected from a variety of materials, a variety of different functional structures can easily and cheaply be produced for a wide range of different applications. For example, the non-shrinkable core may be printed to produce aesthetically pleasing panels, or used for electrical applications (e.g. built in wiring or electromagnetic shielding). This core functionality may thus be easily selected and remains protected from the environment by the shrinkable film (cap) layers.

The present invention may thus be used to form corrugated structures from thermally shrinkable materials. Prior to activation (exposure to conditions to cause shrinkage of one or more shrinkable film layers), the laminate may be in a flat, non-corrugated form, which may be easily wound on a roll. After activation, the shrink films pull the structure into its corrugated shape.

As noted, the "shrinkable film layer" may be selected from a variety of polymer components having selected physical properties such as glass transition temperature, tensile modulus, melting point, surface tension, and melt viscosity. According to the invention, three-dimensional structures may thus be produced from shrinkable film or sheet.

Figure 5:
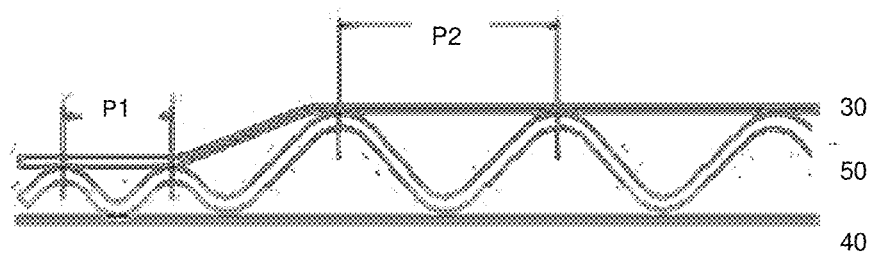
FIG. 5 depicts an example of varying thickness of a corrugated structure made from a laminate according to the invention obtained by varying the bond line spacing.

We note that the spacing of the bond lines need not be uniform. Thus, in one aspect, the thickness of the resulting structure H upon shrinkage of the shrinkable film layers may differ within the structure due to differences in the bond line spacing P. See, for example, FIG. 5 where P2 and P1 denote the different bond line spacings of the thick and thin sections respectively. The ratio of the maximum value of P to the minimum value of P within the resulting structure P2/P1, may thus be, for example, 1.1 or greater, or 1.2 or greater, or 1.5 or greater.

A variety of materials may be used for the non-shrinkable core. The non-shrinkable core material may be a plastic film such as a copolyester, polyester, acrylic, olefin, polycarbonate, polyimide, polyamide, styrenic, acetal, cellulose ester, urethane etc. It may be a thermoset or a thermoplastic plastic, but is not limited to plastics, and may (depending on the end-use application of the corrugated structure) also be a metal foil, paper, a non-woven, a fabric, and so forth. The non-shrinkable core material may be selected to provide desired functionality so long as said material selection allows for bonding of the core to the shrinkable film layers. It is also preferred that the core material have a softening temperature near to or above the temperature of shrinkage for the shrinkable film. This is to prevent undesirable deformation of the core due to premature softening during the corrugation process. For plastic cores, this softening temperature usually denotes the glass transition temperature Tg, or the melt temperature Tm.

The shrinkable film layers may, for example, be a material that will shrink when exposed to an elevated temperature or radiation to induce an elevated temperature. Preferred materials include polyesters, copolyesters, PVC, polycarbonates, styrenics, olefins, polyamides, polyimides, cellulose esters and the like. Such shrinkable film layers may be produced by orienting the film in a single direction, or uniaxially, above its Tg or Tm using film stretching equipment (e.g. MDO drafters, tenter frames, calendering lines, blown film lines, etc.). The film may thus be made to shrink uniaxially, or equibiaxially, or non-equibiaxially depending on how much it is oriented or stretched in a given (planar) direction. The resulting shrinkage depends on the stretch ratio imparted during orientation, as well as intrinsic characteristics of the material.

The shrinkable film layers according to the invention may comprise polyesters of various compositions. For example, amorphous or semicrystalline polyesters may be used which comprise one or more diacid residues of terephthalic acid, naphthalene-dicarboxylic acid, 1,4 cyclohexane-dicarboxylic acid, or isophthalic acid, and one or more diol residues, for example ethylene glycol, 1,4-cyclohexane-dimethanol, neopentyl glycol, or diethylene glycol. Additional modifying acids and diols may be used to vary the properties of the film as desired.

The present invention provides a way to easily make corrugated structures using only sheet stock or film. Curvature may be provided into the panels by controlling the relative shrinkage of the layers. Further, the present invention has the advantage that the structure may be left in a rolled/flat form for ease of shipping with formation of the bulkier corrugation performed only when needed. Because the non-shrinkable core can also be modified to impart functionality, a variety of different structures can easily and cheaply be produced for a wide range of different applications. For example, the core can be printed to produce aesthetically pleasing panels, or used for electrical applications (e.g. built in wiring, electromagnetic shielding). This core functionality can easily be modified and remains protected from the environment by the shrinkable cap layers.

Typically, film or sheet extrusion may be used to create the core. This can be achieved, for example, by cast extrusion, sheet polishing, blown film, calendering, etc. There really is no limit as to how the non-shrinkable core is made, only that the thickness be within the desired range for corrugation as described above. Typically, thicknesses will range from about 0.01 to 10 mm for the non-shrinkable layer core, but thinner or thicker constructions can be contemplated by one of ordinary skill depending on the modulus of the core material. The non-shrinkable core may also contain any of a number of normal additives and processing aids, colorants, pigments, stabilizers, antiblocks, etc. as long as these do not adversely affect subsequent bonding to the shrinkable layers. Multi-layer coextruded or laminated structures can also be useful, particularly for adding additional functionality to the overall structure.

Depending on desired end-use application, the non-shrinkable core can also have texture or thickness variations imparted, for example using lenticular casting rolls, embossing, or post-extrusion modification. This thickness variation can be as simple as a thin spot or cut in the film at certain spots to allow for easier and more controlled buckling. Or it may be a continuous undulating structure imparted via lenticular embossing rolls. Having thin spots/grooves in the core, particularly on the opposing side from a bond line, can allow the core to buckle with less shrink force. This may be advantageous particularly with very thick cores. Grooves and embossed patterns can also be beneficial for aiding bonding such as with ultrasonic staking.

Similarly with structures utilizing adhesives or solvents, the grooves can be added to help keep the adhesive or solvent within a specific area and prevent "squeeze-out" when the layers are pressed together. Other modifications such as pre-creasing, slitting, scoring, die-cutting, thermal pre-forming, etc., might also be used to aid in guiding the corrugation in some applications. Similarly, the use of selective heating to soften certain points of the structure more so than others might be beneficial as softening the material has the same effect as reducing the local thickness. For example, dyes or other electromagnetic radiation absorbers might be selectively added or printed on certain sections of the structure to make these regions heat up more, to further control the corrugation process. In one embodiment, the adhesive itself is modified to be more absorbent to radiation thereby reducing the modulus of the core and allowing buckling at a lower shrink stress.

The shrink layers of the present invention are produced similar to the core except that the film will also be oriented. Orientation can be achieved by traditional stretching on a tenter, drafter or blown film, or it can be imparted as part of a traditional process such as calendering. Because the present invention is characterized by relatively low shrinkages, it is also possible to make sufficiently oriented films on, for example, a traditional cast line, by using high draw down speeds and rapid quenching of the film.

The shrink films can be stretched uniaxially or biaxially, and the biaxial orientation can be equibiax or non-equibiax. Uniaxial orientation is better for producing corrugation in substantially one direction, whereas biaxially oriented films can be used to produce, for example, radially symmetric type structures (e.g. bowls). Non-equibiax films that stretch a different amount in each of two different directions, can be useful for creating unusually curved corrugations.

In assembling and constructing the self-corrugating laminate of the present invention, the shrinkable film layers are discontinuously bonded to the non-shrinkable core along bond lines. In order to generate the desired structural corrugations in the non-shrinkable core upon shrinkage of the shrinkable layers, the bond lines that bond the upper shrinkable film layer to the top surface of said non-shrinkable core are staggered relative to the bond lines that bond said lower shrinkable film layer to said bottom surface of said non-shrinkable core. Typically, the resulting laminate has an "A/B/A" configuration where A represents the shrinkable film layers and B is the non-shrinkable core. This bonding can be performed by any number of batch, semicontinuous or continuous methods. For example, the self-corrugating laminate may be constructed using a continuous process (e.g. a roll-to-roll process) that includes feeding the non-shrinkable core from a roll between upper and lower shrinkable film layers also from rolls to form an sheet assembly and bonding the top and bottom surfaces of the non-shrinkable core to the upper and lower shrinkable film layers respectively along bond lines by passing the assembly through a bonding station (e.g. a heat sealer or adhesive applicator). The resulting self-corrugating laminate could then be wound into a roll form for later use, or cut to length to form individual laminates. Alternatively, the laminate may be constructed using a manual/batch process such as a "cut and stack" operation that includes cutting heat shrinkable film material and non-shrinkable core material to form upper and lower heat shrinkable film layers and non-shrinkable core; forming a stack that includes the upper and lower heat shrinkable film layers with the non-shrinkable core therebetween; and bonding the top and bottom surfaces of the non-shrinkable core to the upper and lower shrinkable film layers respectively along bond lines. The bond or weld lines will be perpendicular or substantially perpendicular to a shrink direction of the film. For uniaxial shrinkable film, this means the bond line is approximately perpendicular to the direction of stretching/shrinking. For equibiax shrinkable films, the bond lines can be either radial or concentric or annular for radially symmetric structures, or in a variety of directions if the film shrinks equally in all directions (i.e. there is no single shrinkage direction). It is not required that all bonds be perpendicular to the shrinkage direction, as some can also be skewed. As may be recognized by one of ordinary skill, the less near to perpendicular to the direction of shrinkage, the less corrugation the bond lines will induce.

The bond line can be formed by any suitable method and take any suitable form. For example, the bond line can be in the form of a continuous line, or in a linear or curved discontinuous pattern of "spot-welds", or some combination of the two. Bonding along the bond line can be achieved through traditional adhesives, such as with the use of epoxies, urethanes, cyanoacrylates, UV curable adhesives, and the like as well as conductive adhesives. It can also be achieved by mechanical fasteners such as rivets, sewing (thread), screws, bolts and the like. It can be thermal in nature as induced by heat sealing, induction sealing, RF sealing, laser welding, or ultrasonic welding. It can also be induced by solvent welding. Methods like UV adhesive bonding and solvent welding have the advantage that the bond lines can be printed on using traditional printing methods (e.g. gravure). But these are also limited in that good adhesion/cohesion is required as well as compatibility between the film layers and the adhesive/solvent. Bonding can also be achieved by coating the whole area of the core or shrink layer and only selectively activating bonding by energy field methods (e.g. laser or UV).

Because we are bonding multilayer structures in controlled patterns, it may also be desirable to incorporate energy absorbers to focus heating in certain areas. For example, near-infrared absorbing additives are well known for use in polyester, and these could be added or printed on in specific locations, or only in certain layers, to focus heat only in key bonding areas. Similar additives exist for laser bonding and even dark inks/paints can cause significant localized absorption from high wattage heating lamps (e.g. quartz lamps). These can be painted on where localized heating is most desirable, otherwise most of the incident radiation passes through the structure. For electric-field-based systems like RF/microwave heating, metal susceptor films can be incorporated. These could be printed onto the non-shrinkable core or shrinkable film layer, or pre-printed on a separate substrate and laminated onto the non-shrinkable core to focus radio-frequency absorption in certain areas. These typically would take the form of thin strips or "wires" in the vicinity of where heating and bonding is need.

As thermal methods like RF sealing can produce extremely strong patterned bonds and may not be conducive to producing staggered bond patterns in 3-layer A/B/A structures, care must be taken when creating bond lines to avoid inadvertent bonding of all layers between the RF transducer and the ground plate.

The spacing between bonds Po can be varied over a wide range. Narrower bonds result in thinner total panel thickness (H) whereas wider spacing leads to thicker panels in general. The only restriction on spacing is the bonding method and shrink force imposed. Very narrow bonds (i.e. small Po) require higher shrink forces and impose more stress on the bond. Similarly, the lower limit on spacing is dictated by the minimum width of the adhesive bond line itself. For applications where very thin bond/weld lines are acceptable, very small values of Po can be used. Alternatively, selective heating/cooling of the layers can be performed (e.g. forced air on certain sections) to allow the core to be hotter/softer than the shrink layers and thereby minimize the amount of shrink force needed.

The self-corrugating laminates of the present invention are useful in in forming corrugated structures, defined herein as structures having at least one corrugated component. Another aspect of the present invention, therefore, is a method for forming a corrugated structure. This method of the present invention includes procuring, for example through manufacture or commercial transaction, a self-corrugating laminate of the present invention and subjecting the self-corrugating laminate to conditions sufficient to impart corrugation to the non-shrinkable core of the laminate. Preferably, the subjecting step includes exposing the shrinkable film layers of the self-corrugating laminate to a temperature sufficient to cause shrinkage of both shrinkable film layers. Typically, this temperature is a temperature at or above the shrinkage temperature of both shrinkable film layers assuming for convenience and without limitation that the shrinkable film layers are formed from the same material. By way of example, the temperature for the exposing step should be at least about 20° C. higher than the Tg for the material from which the shrinkable film layers are formed when the material for each layer is the same amorphous polymer. If different materials are used in forming the shrinkable film layers, the temperature for the exposing step is at or above the highest shrinkage temperature between and amongst the shrinkable films.

It is generally preferred that the temperature employed in the method of the present invention not exceed the softening temperature of the materials from which the non-shrinkable core is formed. It can be important that the core be of consistent modulus during the process in order to ensure uniform corrugation. If, for example, the core Tg is similar the shrinkage temperature, then the core could be prone to softening and modulus variation which could result in uneven corrugation, unless very precise temperature control is employed. Generally, however, it is acceptable if the softening temperature of the non-shrinkable core is below the temperature employed in the method of the present invention.

The step of exposing the shrinkable film layers of the self-corrugating laminate to a temperature causing them to shrink can be effected by any suitable means and/or media known in the art, for example hot air exposure, immersion in a hot fluid, steam exposure etc. It is also possible to employ in the exposing step electromagnetic field methods such as IR, electromagnetic or conductive heating in embodiments where the shrinkable film layers are formed from a material sufficiently susceptible to temperature increases via an imposed energy source. By way of example, the presence of an IR absorber as a component of the shrinkable film layers might promote shrinkage of the shrinkable film layers when exposed to infrared heaters while leaving the non-shrinkable core at a relatively lower temperature.

For embodiments where a curved or otherwise shaped corrugated structure is desired, the process for forming the corrugated structure can further include shaping the corrugated structure. In a first embodiment the shaping step is performed simultaneously with the temperature exposure step, most preferably with the temperature exposure step performed in the presence of a mold or other shaping device which shapes the overall structure while not impacting the corrugation of the non-shrinkable core achieved by the temperature exposure step. In another embodiment, the shaping step is performed subsequent to the temperature exposure step. We have observed that a particularly suitable corrugated structure can be achieved when the laminate is placed in a hot mold and allowed to form with only very light mold pressure to guide the overall structure. In this situation, corrugation is activated by the elevated temperature of the mold and occurs simultaneously with molding as the overall structure softens and is pushed against the mold tooling. It will be understood by one of ordinary skill that composite corrugated structures that include two or more individual corrugated structures of the present invention may be contemplated. For example, a composite corrugated "stack" that includes multiple corrugated structures, with each corrugated structure formed from the self-corrugating laminate of the present invention, can be formed. The individual corrugated structures can be built together as a continuous stack or be individual corrugated structures laminated together. Furthermore, each structure in the stack can have differing geometries and/or preferred orientations from others. For example, one structure in the stack might be oriented perpendicular to another in a cross ply configuration, or at 45 degree angles in a bias ply in order to provide more flexural rigidity. Depending in part on the orientation of the individual structures, a stack can be may subjected to corrugation conditions as a single unit that includes multiple corrugated structures. Alternatively, individual corrugated structures can be subjected to corrugation conditions separately and then bonded or laminated together to form a stack.

In one aspect, the core or non-shrinkable layer can be made functional in a variety of ways, and the shrink film layers then create the 3-D structure needed to make the functionality useful. Some of these will now be described.

Figure 4:
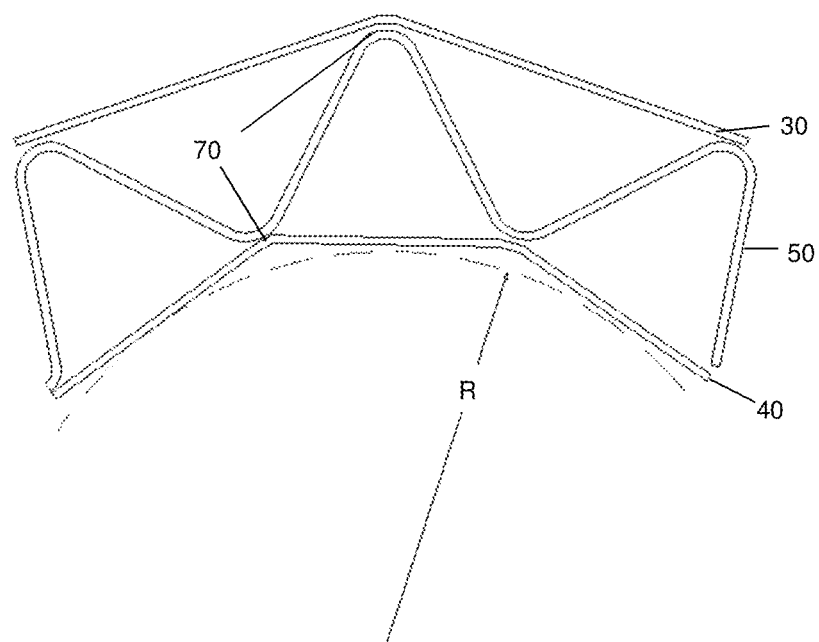
FIG. 4 depicts a curved structure made from a laminate according to the invention resulting from different shrinkages on the upper and the lower shrinkable film layers.

In one embodiment, the corrugated structures obtained according to the invention can have curved surfaces (see FIG. 4). Curvature can be induced by guiding the laminates of the invention with molds while they are being corrugated or anytime thereafter, or by utilizing upper and lower shrinkable film layers having differing shrinkage. In FIG. 4, layer 40 has a greater shrinkage than 30. Typically, the radius of curvature denoted by R, can be controlled via the following kinematic relationship:

$$(100-x2)/(100-x1)=1+H/R \quad (5)$$

where H is the total thickness of the structure, and x1 and x2 are the shrinkages (%) for layers 1 and 2 respectively. For example, if x1 and x2 are equal, R will approach infinity denoting a flat non-curving structure. Similarly, if x2 is larger than x1, a negative value of R results which indicates that the curvatures concave portion is facing the layer 2 side. The curvature of corrugation may be somewhat faceted in nature, but this faceting can be minimized by using smaller P spacing between bond points. In one aspect, only one shrinkable film layer need be applied to the core or non-shrinkable film layer in which case the other shrinkage value defaults to zero, resulting in highly curved or coiled structures.

In another embodiment, the core could already be in a 3D configuration prior to corrugation. This might allow for even more unusual and curved final part shapes. For the aspect of the present invention that is useful for the manufacture of thermoelectric devices, it is preferred but not required that the core has a substantially flat, smooth, 2D configuration.

Typically, the shrinkable film layer is oriented. The term "oriented", as used herein, means that the shrinkable film layer is stretched to impart direction or orientation in the polymer chains. The shrinkable film layer, thus, may be "uniaxially stretched", meaning the shrinkable film layer is stretched in one direction, or "biaxially stretched," meaning the shrinkable film layer has been stretched in two different directions. Typically, but not always, the two directions are substantially perpendicular. For example, in the case of a film, the two directions are in the longitudinal or machine direction ("MD") of the film (the direction in which the film is produced on a film-making machine) and the transverse direction ("TD") of the film (the direction perpendicular to the MD of the film). Biaxially stretched articles may be sequentially stretched, simultaneously stretched, or stretched by some combination of simultaneous and sequential stretching.

In the embodiment where the self-corrugating laminate of the present invention is useful for the manufacture of thermoelectric devices, at least one of the shrinkable film layers may further include a thermally conductive layer applied thereto after corrugation, formed from a thermally conductive metal or ceramic such as, for example, alumina, steel, aluminum, copper, graphite or bronze. Similarly other fixtures or layers can be attached to the self-corrugating laminate or corrugated structure such as fans, fibrous mats, wicking/cooling material, conductive film/sheet, heat sinks, cooling fins, and so forth. Attachment of these additional fixtures will typically be after the corrugated structure is formed unless the fixture does not otherwise impede the corrugation process (e.g. film or fiber layers).

In another embodiment, the shrinkable film layers of the structures further include a thermally conductive layer to make them more thermally conductive, for example by metallization or the use of conductive inks or fillers in order to improve thermal heat transfer. This can only be performed on sections that are not in contact with the thermoelectric pattern otherwise electrical shorting may occur.

The properties of the shrinkable layers depend on and can be varied by manipulating the stretching time and temperature and the type and degree of stretch. The stretching typically is done just above the glass transition temperature (e.g., Tg+5° C. to Tg+60° C.) of the polymer matrix.

In another embodiment, one or more of the shrinkable film layers can be a stretchable elastic material such as rubber. This can include material like natural rubber, styrene-butadiene rubber, thermoplastic elastomers and the like. In this embodiment, the shrinkable film layer is manually held by tensional force in a stretched configuration while bond lines are formed and the corrugation of the non-shrinkable core layer is activated by releasing the tensional force. The shrink stresses and corrugation performance of the shrinkable film layer are otherwise identical to embodiments utilizing thermally activated shrinkable film layers with regards to shrink stress, shrinkage effects, and so forth. In a similar manner, shrinkable film layers activated by other factors (e.g. moisture contact) are also envisioned.

In another embodiment, the bond spacing P is used to control the thickness of the resulting structure. This can include having corrugated panels that change thickness with distance by increasing or decreasing P (e.g. P2 and P1) over the dimensions of the structure (see FIG. 5). For a given shrinkage, the thickness H of the structure will be directly dependent on Po (or P). The wider the spacing of the bond lines, the thicker the final corrugated structure. This will allow for aesthetically pleasing curved surfaces that can be controlled simply by varying the bond spacing.

Figure 6:
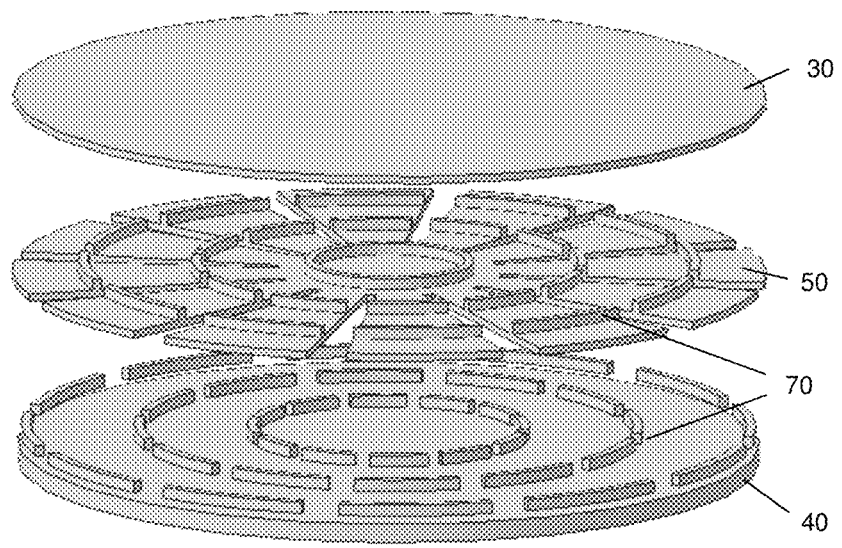
FIG. 6 is an exploded elevational view of a laminate according to the invention by which a radially symmetric corrugated structure may be made using a biaxially-oriented film.

Radially symmetric parts can be produced using biaxially oriented films as depicted in FIG. 6. The top shrinkable film layer 30 and/or bottom shrinkable layer 40 may have a fluted core and concentric bond lines 70.

Thus, for example, bowl type structures can be created using concentric or annular rings of bond lines staggered between the top and bottom shrink layers. Because the shrinkage pulls the material inward toward the center, the core material will tend to bunch up and retard proper corrugation. It has been found that the core may be modified to allow corrugation by cutting flutes out to give room for corrugation and contraction. As the material shrinks and pulls in, the core flutes pull together and close the gap resulting in a more continuous structure. Otherwise the guidelines for producing corrugation are similar to those for uniaxial corrugation as described previously.

According to various embodiments, the non-shrinkable core can include or compose a number of functionalities. For example, the core can be printed or decorated to provide aesthetic properties (as can the shrinkable film layers). Distortion printing might be preferred to ensure proper artistic definition in the final structure.

In one particular such embodiment, the non-shrinkable core of the self-corrugating laminates of the present invention further includes a thermochemical pattern on at least one surface thereof and the laminates are useful in the manufacture of thermoelectric devices. A "thermoelectric pattern" is defined as a generally geometric arrangement of adjacent alternating electrically conductive or semi-conductive elements of differing electrical conductivity (with connective circuitry) selectively patterned and connected and capable of generating (i) a temperature difference across the pattern when an electrical current is applied or (ii) electrical current when a temperature difference is applied across the pattern. Devices or modules based on the principles of thermoelectricity are well known in the art and are described for example in U.S. Pat. Nos. 4,065,936; 4,859,250; 7,851,691; and 8,378,205, the disclosures of which are incorporated herein by reference.

Figure 7:
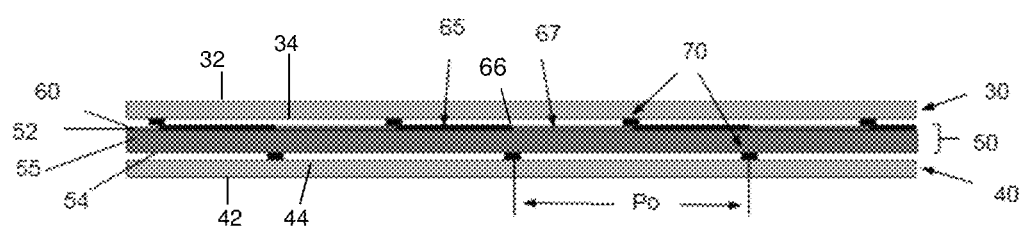
FIG. 7 is a cross-sectional view of one particular embodiment of the self-corrugating laminate of the present invention useful in the manufacture of thermoelectric modules.

FIG. 7 of the drawings illustrates one embodiment of the self-corrugating laminate of the present invention that is useful in the manufacture of thermoelectric devices. As depicted in FIG. 7, the laminate includes first (or upper) and second (or lower) shrinkable film layers 30 and 40 and a non-shrinkable core 50 bonded there between. The shrinkable film layers have outer surfaces 32 and 42 and inner surfaces 34 and 44 for layer 30 and 40 respectively. Non-shrinkable core 50 includes a top surface 52 and a bottom surface 54 each of which are bonded to respective shrinkable film layers 30 and 40 along bond lines 70. Shrinkable film layer 30 is bonded to non-shrinkable core 50 along inner surface 34 and shrinkable film layer 40 is bonded to non-shrinkable core 50 along inner surface 44. The non-shrinkable core 50 further includes a thermochemical pattern 60 on at least one surface thereof (depicted in FIG. 3 by way of non-limiting example on the top surface 52). Thermoelectric pattern 60 includes a series of adjacent alternating electrically conductive or semiconductive thermoelectric elements of differing Seebeck coefficient denoted by 65 and 67 connected at junctions denoted by 66. The junctions 66 typically include overlapping edges of adjacent alternating elements. Junctions 66 may include conductive deposits 75 such as adhesives, inks, or tapes to establish, maintain or improve connectivity and fatigue resistance as well as minimize junction contact resistance. A suitable compound for deposits 75 is a silver or nickel filled epoxy that has been rubber modified.

The Seebeck coefficient S for a material is the voltage created per unit of temperature drop $\Delta T$ across that junction. For a thermoelectric junction therefore, the net voltage is $(S_A-S_B)*\Delta T$ where the subscripts refer to thermoelectric material A and B respectively. To maximize voltage, it is therefore important to maximize $S_{AB}=S_A-S_B$. Note values of S can be negative so choosing, for example a material with high positive $S_A$ coupled with a material having a large negative $S_B$ is desirable (an example of this is chromium which has a value S=+18.8 uV/K and nickel which has a value S=−18.0 uV/K at room temperature).

The arrangement, location and layout of elements 65 and 67 of pattern 60 as depicted in FIG. 7 is not meant to be limiting and other patterns can be envisioned. For example, to minimize flexing of the thermoelectric junctions across the highly curved portions of the corrugation, it may be desirable for pattern 60 to be configured as described in more detail below and best shown in FIG. 10. This also has the benefit of not exposing the thermoelectric material to the bonding that occurs at bond lines at the top and bottom portions of the corrugation.

The thermoelectric pattern 60 may be formed on a surface of the non-shrinkable core using coating methods and techniques well known in the art. Non-limiting examples of suitable methods include printing, painting, evaporative coating, sputter coating, chemical vapor deposition, ion-beam assist deposition, molecular beam epitaxy, solution coating and the like. Preferred techniques include evaporative coating and sputter coating. Suitable known masks, photoresist or etching techniques may be utilized in conjunction with the method for forming thermoelectric pattern and the related alternating thermoelectric elements.

Choices for thermoelectrically active materials from which to form the alternating elements of the thermoelectric pattern will be readily apparent to one of ordinary skill in the art. Suitable thermoelectrically active materials are listed for example in *the CRC Handbook of Thermoelectrics*, D. M. Rowe Ed., CRC Press, NY, 1995. Some of the most commonly used thermoelectric materials include tellurium alloys such as bismuth tellurium and lead tellurium.

Prior to formation of the thermoelectric pattern on the surface of the non-shrinkable core, the surface of the core may optionally be pre-treated by known techniques such as for example flame or corona treatment or ion bombardment which are known by skilled artisans to enhance coating-to-substrate adhesion. Further, the thermoelectric pattern may be subjected to known treatments such as annealing after formation on the surface of the non-shrinkable core.

It should be recognized that various parameters and features of the thermoelectric pattern and the thermoelectric elements, for example element and pattern area, element and pattern thickness, number of junctions and geometry, can be adjusted as appropriate to achieve the performance expectations for the resulting thermoelectric device. For example, geometric aspects of the thermoelectric elements can be adjusted based on the final fitness-for-use criteria of the device. For the embodiment shown in FIGS. 7-9, each element length is typically set equal to Po/2 so that the junctions 66 are located substantially near to and along the bond lines 70. In this embodiment, adjacent elements abut and connect to form a junction when element length is approximately equal to Po/2; however, it is to be understood, that the element length can optionally be slightly less than Po/2 and a flexible conductive coating, adhesive, tape or deposit 75 used to connect adjacent elements at their junction 66. Because the junctions already exhibit higher tensile stresses due to bending after corrugation, this approach could help to minimize the chance of cracking and flexural fatigue at junctions. The width of the element can be influenced by the overall target resistance of the device. Resistance can be minimized if appropriate by ensuring good connection between the junctions. For example by ensuring some slight overlap of the adjacent thermoelectric elements at their junction. Further, elements of relatively greater thickness, while typically improving device performance, tend to be more brittle and require more material thereby increasing cost.

For the present invention, the element widths are typically between 0.01 Po to 100 Po, more preferably 0.1 Po and 10 Po. The coating thickness is typically between 0.001 to 100 um and more preferably between 0.01 and 10 um. Note that thickness for adjacent thermoelectric elements need not be the same and it is often desirable to optimize the thickness of an individual element independently from that of the adjacent element based on the thermal and electrical properties of the materials employed.

Figure 7A:
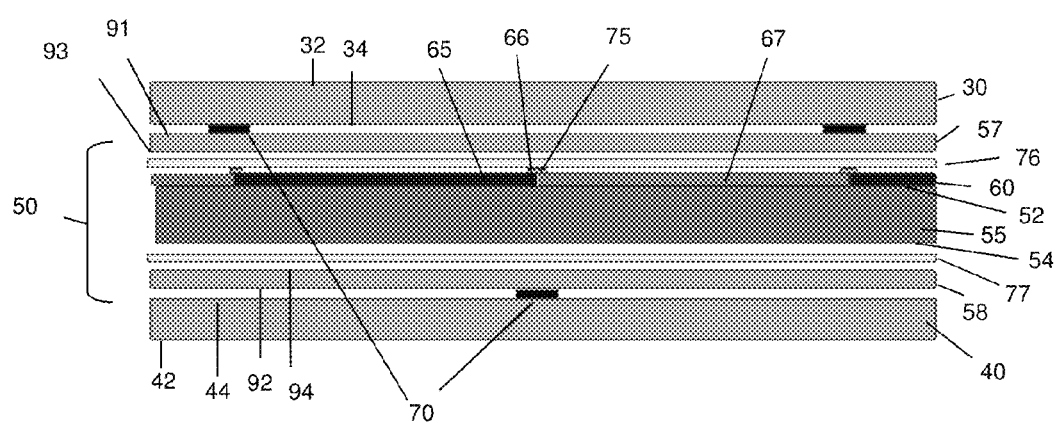
FIG. 7a is cross-sectional view of another particular embodiment of the self-corrugating laminate of the present invention useful in the manufacture of thermoelectric modules.

As shown in FIG. 7a, the non-shrinkable core 50 of the present invention may optionally include multiple layers. For example, the core 50 may include a layer 57 between thermoelectric pattern 60 and shrinkable film layer 30 to for example assist in protecting the pattern 60 and to improve distribution of applied stresses. Layer 57 includes outer and inner faces denoted at 91 and 93 respectively and layer 57 is bonded along its inner face 93 to thermoelectric pattern 60 at bonding layer 76. Non-shrinkable core 50 may also optionally include layer 58 (having outer and inner faces denoted by 92 and 94 respectively) which is bonded along its inner face 93 to substrate layer 55 on which the thermoelectric pattern 60 is applied at bonding layer 77. These bonding layers could be in the form of for example, lamination layer, adhesive, double sided tape or the like and would also be considered part of the non-shrinkable core 50. Any optional additional layers included in core 50 are to be formed from non-shrinkable film with form, composition and dimensions selected to minimize any negative impact on performance of a thermoelectric module formed from the self-corrugating laminate of the present invention.

A preferred method for making this embodiment of the present invention requires that A/B structures be produced. A single roll of shrink (A) and core (B) can be bonded with any of the above methods to create the periodic bond spacing. Two such rolls of this A/B structure can then be laminated/bonded/joined together to produce an A/B/C/B/A structure where C refers to an additional non-shrinkable core layer preferably containing the thermoelectric elements (this is depicted in FIG. 7a). Even though the two A/B structures can originate from the same base roll of material, it is important to note that they should be staggered by approximately Po/2 before being laminated together, so proper registration is required. Lamination can be by any traditional method including using an extrusion/tie layer, an adhesive, solvent bonding etc. This preferred embodiment allows for greater flexibility in producing very strong corrugated base materials. Thus, in this aspect, the self-corrugating laminates of the invention comprise a non-shrinkable film layer formed from two non-shrinkable film layers adhered to one another, each of these non-shrinkable film layers having bonded thereto a shrinkable film layer using bond lines as already described.

Figure 8:
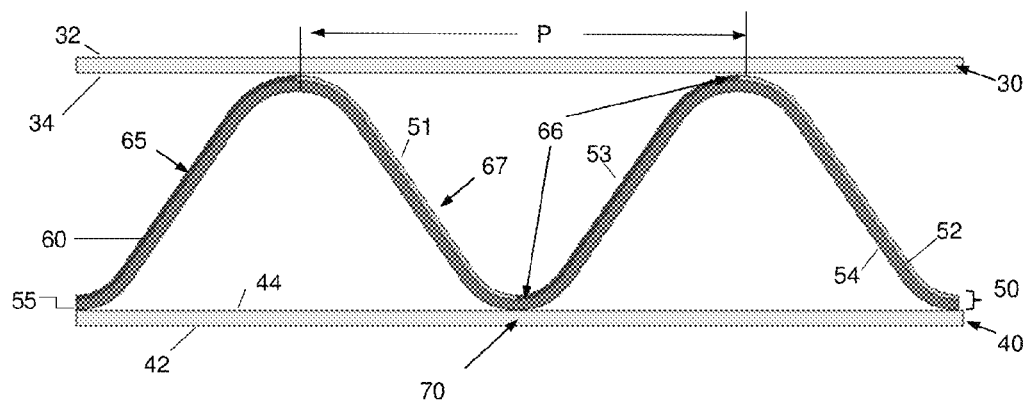
FIG. 8 is a cross-sectional view of a corrugated structure of the present invention useful as a thermoelectric device and formed from the self-corrugating laminate of FIG. 7
Figure 9:
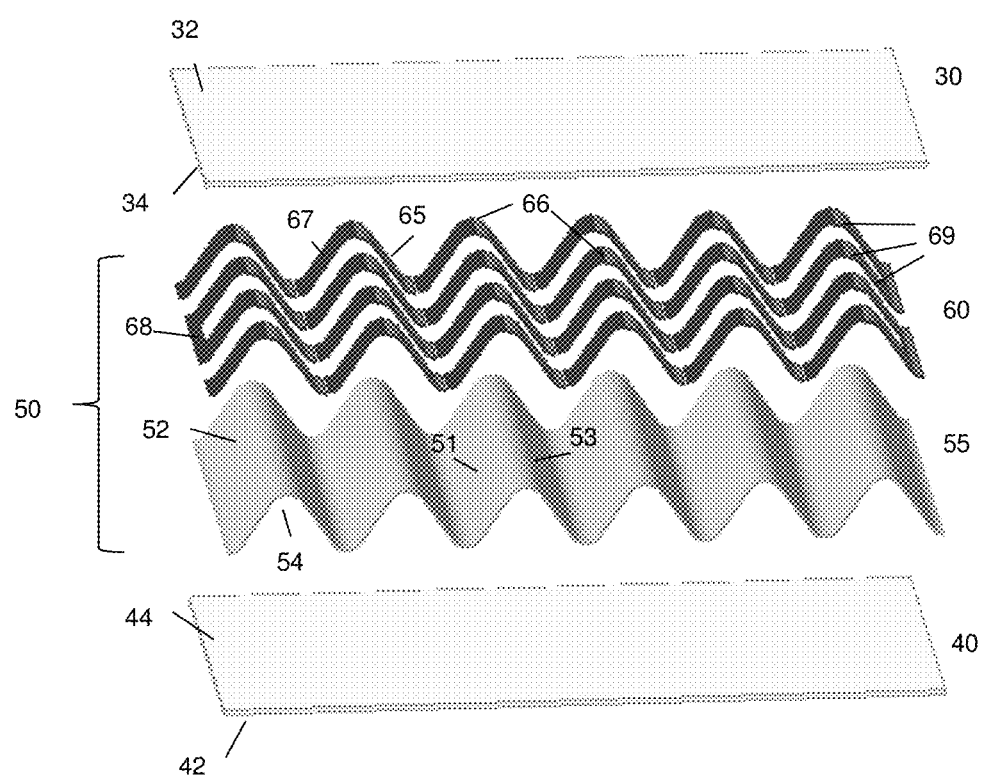
FIG. 9 is an exploded elevational view of the corrugated structure of FIG. 8.

FIGS. 8 and 9 illustrate an embodiment of the self-corrugating laminate of the present invention depicted in FIG. 7 after that self-corrugating laminate has been subjected to conditions as described herein sufficient to form structural corrugations in the core 50 thereby forming a corrugated structure useful as a thermoelectric device or module. Upon causing the shrinkable film layers to shrink, the non-shrinkable film layer 50 is corrugated to form a corrugated core that preferably also provide structural support for the module. These corrugations in the corrugated core also establish separation of alternating thermoelectric junctions into a "hot" side and a "cold" side of the module thereby making it thermoelectrically viable. The module may therefore be used, for example, to form thermoelectric generators, coolers/heaters or sensors.

As shown in FIGS. 8 and 9, the module includes a corrugated core 50 having a top surface 52 and a bottom surface 54 each with opposing alternating faces 51 and 53 and including a thermoelectric pattern 60 on at least one surface thereof (depicted in FIGS. 8 and 9 by way of non-limiting example on the top surface 52). In this embodiment, the thermoelectric pattern 60 includes alternating elements 65 and 67 on alternating faces 51 and 53 that connect at junctions 66 and are arranged in parallel rows. In the embodiment shown in FIGS. 8 and 9, junctions 66 are aligned substantially near to and along bond lines 70 and rows 69 of junctions 60 are connected in series via end connectors 68 to from a serpentine geometrical pattern.

Figure 10:
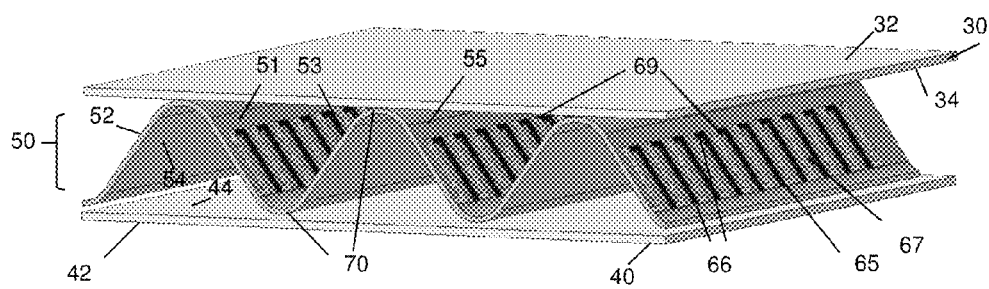
FIG. 10 is a side elevational view of another particular embodiment of the corrugated structure of the present invention.
Figure 11:
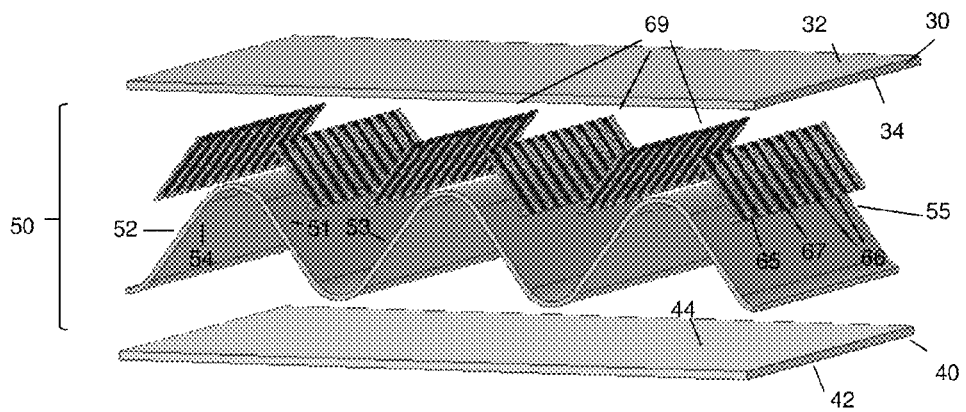
FIG. 11 is an exploded elevational view of the particular embodiment of the corrugated structure of the present invention shown in FIG. 10.

An alternative embodiment for the thermoelectric pattern 85 is depicted in FIG. 10. In this embodiment, alternating elements 65 and 67 connect at junctions 66 which are located on at least one of the faces of one or more surface of the core 55. In this embodiment, junctions 66 can be located on a single face 51 or multiple faces 51 and 53 and further be located on faces that are on one or both of the top surface 52 and bottom surface 54 of the core film 55. Although not shown in the Figure, it is understood that rows 69 of junctions may be interconnected in series or parallel via additional end connectors that can take the form of mechanical wires, conductive tape and the like. It will be understood, by one of ordinary skill that various geometries and connections can be utilized.

The non-shrinkable core can also optionally incorporate other features such as conduits, electrical conductive networks (e.g. flexible circuits), RF shielding via metallized coatings, fibrous structures for filtration, and so forth. These can be directly added into or onto the core, or sections of the core could be cut out prior to corrugation to allow for these features to be added. In one embodiment, flexible circuits consisting of etched copper coated polyimide could be laminated to portions of the core to provide embedded wiring in the corrugated structure. In addition to the cores, other separate components can also be integrated between the film layers prior to thermal application or corrugation.

The core can also optionally contain reinforcing materials such as fiber/flake reinforcement where structural applications are intended. These can be an integral part of the core or added on via adhesion or lamination.

End-use applications for the self-corrugating laminate of the present invention can vary widely. As described herein, one embodiment of the self-corrugating laminate is useful in the manufacture of thermoelectric devices or modules. The corrugated structure resulting from subjecting the self-corrugating laminate to corrugation conditions can also serve as a light guide or can incorporate optical elements such as OLED, phosphorescent layers, fluorescent materials, liquid crystal layers, etc. Various structural applications of the corrugated structure such as panels, furniture, partitions, etc. can also be envisioned by one of ordinary skill. There are numerous structural and functional applications of such a structure and the above list is not meant to be limiting. Instead, the self-corrugating structures are meant to be building blocks to enable a wide range of new structures and allow for an entirely new manufacturing method.

EXAMPLES

The following experimental methods were used to characterize the films and corrugated structures.

Shrinkage was determined by immersing a 100 mm×100 mm sample of the shrink film sample in water at 95° C. Hot water was used because copolyester shrink films (Tg=72° C.) were used for the experiments. Film was held in the bath for at least 30 seconds to ensure full shrinkage was complete. The length of the sample was then measured and the shrinkage in each direction determined by the following formula:

$$\text{Percent shrinkage} = (Lo-L)/Lo * 100 \quad (1)$$

in which L is the length after shrinkage and Lo is the initial length (100 mm). For shrink films having a Tg>100° C., hot water can no longer be used, so either hot oil or hot air is required. For these tests, the temperature of shrinkage should be at least Tg+20° C. and the sample held until full shrinkage is acquired. This is typically about 30 seconds for liquid media and 1 minute for hot air ovens.

Shrink stress was measured in a similar manner. A strip of film 1 inch (25.4 mm) wide was mounted in a tensile tester apparatus such that slack is removed. The film is then rapidly heated to above Tg and the maximum force recorded. The shrink stress is the maximum force divided by the initial cross-sectional area of the film strip.

The core modulus was taken from the literature for each material and/or measured by traditional tensile testing methods (ASTM D882).

Corrugation quality was determined by visual examination with ratings on a scale from 1 to 5. The following criteria were used:
  Rating 5—excellent quality with uniformly defined corrugation
  Rating 4—good quality with only a few minor defects
  Rating 3—fair quality, unacceptable for many applications
  Rating 2—poor quality (unacceptable)
  Rating 1—very poor quality with corrugation almost unrecognizable (or corrugation did not form)

Examples 1-10

Corrugated Structures with Polycarbonate Core

For these examples, a series of uniaxially stretched films were bonded to a polycarbonate film core using a UV adhesive (Dymax SC330 gel). The copolyester shrink layer comprised Eastman Embrace LV™ (Eastman Chemical Company, Kingsport, Tenn.), a material commonly used for shrink film packaging (Tg=72° C.). To make the shrink film, a cast film 0.25 mm thick was extruded to create the unoriented base material. This film was then stretched on a Bruckner laboratory film stretcher at a nominal temperature of 82° C. Stretch ratio was varied from 1.25× up to 2× which yielded films having shrinkage from about 20% up to 50% (see Table I).

Next these shrink films were cut into 1 inch (25.4 mm) wide strips and then bonded to 25.4 mm wide strips of polycarbonate (core) film using the UV curable adhesive. Small stripes of adhesive were painted onto one side of the core at fixed intervals (Po was either 19 mm, 25.4 mm or 38 mm depending on the example). The core was then affixed to one of the shrink layers and passed through a UV tunnel to cure the bond. This was then repeated on the reverse side of the core using the same bonding interval as before, but with the bonds staggered by Lo/2. This side was then cured with the UV lamp as before.

Upon completion of the base structure, the sample was then exposed to steam to induce corrugation. The steam was supplied by a modified paint stripper plumbed into a metal pot. The film sample was placed into the steam pot, and allowed to shrink/corrugate for about 15 to 30 seconds. The sample was then removed and visual assessment made.

Results of the assessment are shown in Table I. It was observed that good or excellent quality corrugation was achieved when the ultimate shrinkage was in the 20 to 35% range. In contrast, CE7 through CE9 showed very poor quality due to higher shrinkage, which caused excessive wrinkling and inconsistent aspect ratios of the pleats. CE10, in contrast, did not show any signs of buckling because the corrugation ratio was too high.

The aspect ratio (H/P) was found to be a strong function of the shrinkage of the film for all samples tested. For low shrinkage (Examples 1-3), the aspect ratio ranged from 0.29 to 0.33. For the 33% shrinkage films (Ex 4-6) the aspect ratio ranged from 0.52 to 0.56, and for the 50% shrinkage samples (Ex 7-9), the aspect ratio ranged from 0.76 to 0.9. The latter samples also exhibited much more variability in the aspect ratio from peak to peak given the more wrinkled structure.

Examples 11-15

Corrugated Structures with Copolyester

These examples followed the same procedure as with Example 1, except that the core was made from Eastman Tritan™ high Tg copolyester (nominal Tg=120° C.). As with the previous examples poor corrugation resulted because either the film shrinkage was too high, or the corrugation ratio was out of the desired range. Samples with corrugation ratio greater than 1 would not corrugate at all, whereas the very low corrugation ratios would result in excessive wrinkling.

Examples 16-20

Corrugated Structures with an Aluminum Foil Core

This example was the same as above except various thicknesses of aluminum foil were used as the core. Additionally, some of the shrink films having 30% shrinkage were produced on a commercial tenter frame at Marshall and Williams (Providence, R.I.). This allowed us to produce larger areas of film versus the laboratory film stretcher. Aluminum is much higher in modulus than polymeric cores, so thickness and/or Po spacing was modified accordingly. As observed with the data in Table I, the behavior follows the same trend as with polymeric cores.

Examples 21-36

Corrugated Structures with PCTG Copolyester

These examples are similar to Examples 11 through 15 except the tentered shrink film was used instead (samples 21-31). In Examples 31 through 36, biaxially stretched film was used in place of uniax film even though the films were bonded in a linear uniax-like pattern. There was some lateral shrinkage of the film due to the off-axis shrinkage, but the characteristics of the film that control corrugation were still the same as with the true uniaxial shrinking samples.

Examples 37-40

Curved Structures

In this set of examples, the same procedure was followed as Example 1, except that different shrink films were used on side 2 versus side 1 (a 20% shrinkage film was used for side 1 for all examples). The core for all of these samples was a 0.1 mm polycarbonate and the adhesive bond lines were made with UV curable adhesive as before. Bond spacing Lo was also varied. The films were observed to curve with the exact amount depending on Po and the shrinkage of the film. Radius of curvature R, for the inside surface was estimated by tracing the inside edge of the curved corrugated structure and using a compass to try to match the line via trial and error. These values are listed in Table II along with theoretically calculated values based on Equation (5). The curvature was well defined for all of the samples and followed well with theory. Note, however, that Example 40 had such a small radius of curvature that it wrapped into a coil. This could be desirable or undesirable, depending on the end-use application.

Example 41

Larger Corrugated Structure with Stamp Printing Method

To simulate scale-up of the concept, a uniaxial structure was created using tentered copolyester shrink film (1.25×, 30% shrinkage) and a polycarbonate core (0.1 mm). A 225 mm by 120 mm wide sample of each film was cut with the shrinkage direction parallel to the long axis. To simulate printing of an adhesive, a lineoleum block was CNC machined to produce a stamp having 3 mm (nominal) bond lines and a separation Po=19 mm. UV-curable adhesive was wiped onto this linoleum stamp pad using a breyer roll and the adhesive then transferred to the core by pressing the stamp against the film. This was repeated for the reverse side with the bond line staggered by Po/2. Shrinkage and corrugation was induced using a hot air gun. The resulting structure had excellent corrugation definition with a final height H of approximately 6 mm and final P spacing of approximately 14 mm (H/P=0.42).

Example 42

Hermetically Sealed Corrugation

In this example, the shrink layers were made from 30% shrinkage, 0.16 mm thick, uniaxially stretched copolyester and the core was a 0.1 mm polycarbonate. The PC core was cut to a nominal 125 mm wide by 200 mm long. The shrink layers were also cut 200 mm long but were wider (150 mm). Bonding was performed as above using Po=19 mm using the UV curable adhesive. In addition to this bonding, however, the outer edges of the structure were heat sealed using an impulse bar sealer. On the edges of the structure, this created a shrink-to-shrink layer bond since the core width was reduced. Once sealed, the sample was corrugated using hot steam resulting in an excellent quality corrugated structure with air trapped inside the corrugations. Note this was air that was present when sealing occurred which, in turn became further compressed as shrinkage reduced the internal volume. This compressed air made the structure more rigid due to a "pillow" effect (and this air level could be adjusted if desired by controlling the initial amount of trapped air).

Example 43

Corrugation by Two-Layer Process

In this example, a single layer of 30% shrinkage, 0.16 mm thick, uniaxially stretched copolyester was bonded to a 0.1 mm polycarbonate core with a spacing Po=25.4 mm. Bonding was performed by heat sealing via an impulse bar sealer. Width was nominally 200 mm. This film was then cut in half to produce two, 100 mm wide pieces of A/B film.

Next, these two films were bonded together in an A/B/C/B/A structure where A is the shrink layer, B is the core and C is the adhesive. This was accomplished by placing the films together (core against core) and bonding in place using 3M VHB™ adhesive tape. Note that the bond lines were staggered by Po/2 to ensure proper corrugation. This 5 layer structure was then placed in steam to create an excellent quality corrugated structure. The "core" in this case was a composite consisting of 2 layers of 0.1 mm PC film, and the adhesive layer. Such a structure was significantly easier to produce than the traditional 3 layer examples above and was more conducive to a wider range of bonding methods since only 2 layers need be joined at a time.

Examples 44-46

Biaxial Film Corrugation and Formation of a 3-D Structures

In Example 44, two layers of biaxially oriented copolyester shrink film were bonded to a 0.1 mm PC core. The shrink film was stretched 1.25×1.25 (25% shrinkage in each direction) using the Bruckner laboratory film stretcher. Each film layer was cut into a circle with a nominal diameter of 150 mm.

Prior to bonding, eight lobes were cut away from the core similar to FIG. 8. If this extra material was not removed, the core would collapse in on itself during shrinkage and impede uniform corrugation. The layers were then bonded together using UV curable adhesive in a concentric ring pattern. Spacing (Po) between these rings was 19 mm and the top and bottom set of bond lines were staggered by Po/2. The sample was then corrugated by heating with a hot air gun. Corrugation caused the material to buckle in a radially symmetric pattern as the overall radius of the films decreased. The resulting film was flat but corrugated in a ring-like structure.

Example 45 was identical to 44 except that the film was also shaped using a dome shaped mold. The mold—consisting of a matched plug and bowl section—was mounted on a benchtop dental thermoformer (used to make impressions for dental offices). Prior to forming, the mold was preheated to approximately 110° C. The film structure was then placed on the bowl mold while allowing the plug to apply light pressure. As the film began to shrink and corrugate, the plug pressure was increased to help push the part down into the mold. If pressure was applied too quickly, corrugation would not sufficiently develop (or the corrugation would collapse). Vacuum assist was also used to help pull the structure into the bowl cavity and reduce the overall stress on the newly formed corrugations. The net result was a nicely curved bowl shape structure having concentric corrugation.

Example 46 was identical to 44 except that the top layer of shrink film was replaced with a film stretched 1.5×1.5 and having 33% nominal shrinkage in each direction. Upon heating, the shrinkage differential caused the corrugation to naturally curve into a bowl shape. Although mold tooling was not strictly required, it was still used to help guide the structure and produce a more uniform and well-defined surface.

A thermoelectric pattern was produced on a non-shrinkable film layer C by evaporatively coating two different materials, namely bismuth and antimony, on an unoriented copolyester film. The Seebeck coefficients of the two materials are −54 um/K and 35 um/K respectively ($S_{AB}$=89 uV/K). The film layer C was 0.1 mm thick extrusion cast Eastman™ PETG 6763 (available from Eastman Chemical Company, Kingsport, Tenn.) having a Tg=80° C. Prior to coating, the film was corona treated to improve adhesion. Evaporative coating was performed with a Varian model 3115 diffusion pumped high vacuum coater. Each metal was coated separately and was evaporated from graphite crucibles mounted in tantalum box crucible heaters operated @ 200 amps from a 5V power supply. The source to samples distance was approximately 20 inches. The film thickness and deposition rates were monitored with an Inficon model XCT Thin film thickness monitor. Typical film thicknesses were approximately 2.5 microns.

The alternating thermoelectric elements for the pattern were formed using masking in order to create the necessary alternating pattern of interconnected junctions (similar to layout in FIG. 9). A mask was produced for each metal by CNC machining a thin metal plate into the necessary pattern. The mask consisted of cutouts that allowed the coating material to only deposit in certain sections of the film. The film was taped onto the backside of a mask prior to being placed in the evaporative coater. After coating with a given metal, the mask was removed and a second mask applied for use with the second metal. Alignment marks were provided on the masks to aid in proper placement.

TABLE I

| Run # | core | Po (mm) | Shrinkage (%) | Shrink Stress (MPa) | Core E (MPa) | h(core) (mm) | h(shrink) (mm) | corrugation ratio | Rating |
|---|---|---|---|---|---|---|---|---|---|
| 1 | PC | 19 | 20 | 0.4 | 2000 | 0.10 | 0.16 | 0.281 | 5 |
| 2 | PC | 25.4 | 20 | 0.4 | 2000 | 0.10 | 0.16 | 0.157 | 5 |
| 3 | PC | 38 | 20 | 0.4 | 2000 | 0.10 | 0.16 | 0.070 | 4 |
| 4 | PC | 19 | 33 | 1.3 | 2000 | 0.10 | 0.15 | 0.092 | 2 |
| 5 | PC | 25.4 | 33 | 1.3 | 2000 | 0.10 | 0.15 | 0.051 | 4 |
| 6 | PC | 38 | 33 | 1.3 | 2000 | 0.10 | 0.15 | 0.023 | 3 |
| CE7 | PC | 19 | 50 | 3.1 | 2000 | 0.10 | 0.10 | 0.058 | 1 |
| CE8 | PC | 25.4 | 50 | 3.1 | 2000 | 0.10 | 0.10 | 0.032 | 1 |
| CE9 | PC | 38 | 50 | 3.1 | 2000 | 0.10 | 0.10 | 0.014 | 2 |
| CE10 | PC | 19 | 25 | 0.4 | 2000 | 0.15 | 0.16 | 0.948 | 1 |
| 11 | PCTG | 25.4 | 25 | 0.4 | 1520 | 0.15 | 0.16 | 0.403 | 4 |
| 12 | PCTG | 38 | 25 | 0.4 | 1520 | 0.15 | 0.16 | 0.180 | 4 |
| 13 | PCTG | 19 | 33 | 1.3 | 1520 | 0.15 | 0.15 | 0.235 | 3 |
| 14 | PCTG | 25.4 | 33 | 1.3 | 1520 | 0.15 | 0.15 | 0.131 | 4 |
| 15 | PCTG | 38 | 33 | 1.3 | 1520 | 0.15 | 0.15 | 0.059 | 3 |
| CE16 | AL | 50.8 | 30 | 0.72 | 70000 | 0.01 | 0.36 | 0.0004 | 1 |
| 17 | AL | 50.8 | 30 | 0.72 | 70000 | 0.10 | 0.36 | 0.313 | 5 |
| CE18 | AL | 50.8 | 30 | 0.72 | 70000 | 0.02 | 0.36 | 0.003 | 1 |
| CE19 | AL | 25.4 | 75 | 7 | 70000 | 0.02 | 0.36 | 0.001 | 2 |
| 20 | AL | 50.8 | 30 | 0.72 | 70000 | 0.10 | 0.36 | 0.313 | 5 |
| CE21 | PCTG | 25.4 | 30 | 0.72 | 1520 | 0.10 | 0.36 | 0.032 | 3 |
| 22 | PCTG | 25.4 | 30 | 0.72 | 1520 | 0.18 | 0.36 | 0.170 | 4 |
| 23 | PCTG | 25.4 | 30 | 0.72 | 1520 | 0.27 | 0.36 | 0.574 | 5 |
| 24 | PCTG | 19.05 | 30 | 0.72 | 1520 | 0.10 | 0.36 | 0.056 | 3 |
| 25 | PCTG | 19.05 | 30 | 0.72 | 1520 | 0.18 | 0.36 | 0.302 | 4 |
| 26 | PCTG | 19.05 | 30 | 0.72 | 1520 | 0.27 | 0.36 | 1.020 | 5 |
| 27 | PCTG | 12.7 | 30 | 0.72 | 1520 | 0.10 | 0.36 | 0.127 | 4 |
| 28 | PCTG | 12.7 | 30 | 0.72 | 1520 | 0.18 | 0.36 | 0.680 | 5 |
| CE29 | PCTG | 12.7 | 30 | 0.72 | 1520 | 0.27 | 0.36 | 2.295 | 1 |
| CE30 | PCTG | 25.4 | 30 | 0.72 | 1520 | 0.51 | 0.36 | 8.965 | 1 |
| CE31 | PCTG | 19.05 | 30 | 0.72 | 1520 | 0.51 | 0.36 | 7.048 | 1 |
| CE32 | PCTG | 12.7 | 30 | 0.72 | 1520 | 0.51 | 0.36 | 15.859 | 1 |
| 33 | PCTG | 12.7 | 25 biax | 0.6 | 1520 | 0.10 | 0.20 | 0.206 | 4 |
| 34 | PCTG | 12.7 | 33 biax | 2.5 | 1520 | 0.20 | 0.13 | 0.818 | 4 |
| CE35 | PCTG | 12.7 | 50 biax | 3.2 | 1520 | 0.20 | 0.11 | 0.710 | 3 |
| CE36 | PCTG | 12.7 | 66 biax | 4.9 | 1520 | 0.20 | 0.10 | 0.522 | 3 |

TABLE II

Data for Curved Samples

| Run # | Shrinkage Layer 1 | Shrinkage Layer 2 | Po (mm) | H (mm) | Radius of Curvature, R (mm) | R (calc) (mm) |
|---|---|---|---|---|---|---|
| 38 | 20 | 33 | 25.4 | 7 | 44 | 36 |
| 39 | 20 | 33 | 19 | 4.3 | 25 | 22 |
| 40 | 20 | 50 | 19 | 5.5 | 6.5 | 9 |

Example 47

Thermoelectric Embodiment

Part A. Formation of Non-Shrinkable Core with Thermoelectric Pattern.

Each alternating element in the pattern was approximately 3 mm wide and 10 mm long with a period spacing between elements of Po=20 mm. an additional 1 mm was coated on either end to provide overlap and electrical continuity at junctions between alternating elements. The resulting pattern was an interconnected series of alternating thermoelectric elements, each nominally 10 mm long. There were 8 junction pairs in a row consisting of 8 elements of bismuth alternating with 8 elements of antimony. The masking template produced 12 such parallel rows at a time with spacing between rows of approximately 8 mm. Mask design also provided connections to provide electrical conductivity between adjacent rows by bridging across at the end of the rows, thus producing a longer interconnected series of junctions. In this example, the interconnections were made from both bismuth and antimony. While the film layer C could alone function as a non-shrinkable core of the present invention, the non-shrinkable core in this example included two additional non-shrinkable layers B as described below.

Part B. Self-corrugating Laminate Formation

The shrinkable film layers A of the laminate were produced from Eastman Embrace LV™ copolyester (commercially available from Eastman Chemical Company, Kingsport, Tenn.), a material commonly used for shrink film packaging ($T_g=72°$ C.). To make the shrinkable film layers, a cast film 0.18 mm thick was extruded to create the unoriented base material. This film was then stretched on a tenter frame 1.5× at a nominal temperature of 82° C. resulting in a nominal ultimate shrinkage of 33%. The final film thickness was 0.12 mm. In the next step, each shrinkable film layer was RF sealed to a separate non-shrinkable film B formed from Eastman Tritan™ copolyester (nominal $T_g=105°$ C.) (commercially available from Eastman Chemical Company, Kingsport, Tenn.). The non-shrinkable films were each nominally 0.1 mm thick. The RF seal welds consisted of lines that were 3 mm wide across the width of the sample, and were spaced Po=20 mm apart. This produced two separate two-layer A/B structures consisting of a shrinkable film layer A and a non-shrinkable film layer B with a total size of about 100 mm by 300 mm. Weld lines were perpendicular to the long direction.

To create a self-corrugating laminate of the present invention, a multilayer composite of A/B/C/B/A configuration (with A being a shrinkable film layer, B being a non-shrinkable film layer and C being a non-shrinkable film layer with thermoelectric pattern on its surface as described in Part A above) was formed as follows. The B surface of one A/B composite was adhered to the top surface of non-shrinkable film layer C (on which the thermoelectric pattern was coated) using double sided tape (nominally 1 mil thick) commercially available from 3M Company. Similarly, the B surface of the second A/B composite was adhered to the bottom surface of the non-shrinkable film layer C. Care was taken to ensure that the bond lines for the top and bottom layers were staggered by Po/2 to ensure proper corrugation. It is understood that the B/C/B structure constitutes the non-shrinkable core of the present invention with the thermoelectric pattern on the top surface of the C component.

Part C. Formation of Corrugated Structure for Thermoelectric Module

Once the self-corrugating laminate of part B above was assembled, the laminate structure was heated with a hot air gun (Master Heat Gun™ Model HG-501A on high setting rated at 399° C.). The air gun was held about 10 to 20 cm from the film and swept back and forth to heat all parts of the laminate. This induced corrugation in the non-shrinkable core C (which included non-shrinkable layers B) by activating the shrinkage of the shrinkable film layers A. The resulting module was of excellent quality having a total thickness of 4.7 mm and a final P=16 mm. The final module was nominally 40 mm wide and 155 mm long.

Part D. Electrical Testing of Module

Prior to corrugation, a sample of core C with thermoelectric pattern thereon was tested to determine resistivity using a DC ohmmeter. Because the ohmmeter itself provides a current and generates heat by Peltier effect (which affects total resistance), the value obtained was taken as the average of two measurements—the first being a standard measurement and the second with the leads of the ohmmeter reversed (typically the two values are similar if testing time is kept short). It was observed that the resistivity for a given row of alternating thermoelectric elements on core C (10 junction pairs in series) ranged from about 120 ohms to 250 ohms with the variability believed to be the result of slight differences in the masking and overlap of the junctions. Resistance for a single junction pair ranged from about 10 to 15 ohms with contact resistance between junctions being approximately 1 ohm.

For the corrugated module, the 4 rows were interconnected in parallel by shorting across the ends using 3M brand copper tape with conducting acrylic adhesive. This provided electrical connection between the rows as well as a durable surface for connecting the clips of a multimeter. Internal resistance for this parallel structure in the corrugated module was measured to be nominally 70 ohms.

To test for voltage generation, the module was bent around a cup containing ice water at 0° C. The other side was exposed to room temperature air at 23° C. The open circuit voltage for the 8 junction pair module was measured to 13.7 mV. For Sb and Bi having an $S_{AB}=89$ uV/K, the voltage generation is predicted to be 0.71 mV/K for the 8 junctions in series. For a $\Delta T=23°$ C., the total voltage was then predicted to be 16.4 mV which is in good agreement with actual measurement.

Example 48

Modifications of Junctions

This example was produced using just two shrinkable film layers A and a non-shrinkable core B with a thermoelectric pattern arranged in an A/B/A configuration. The thermoelectric pattern is formed according to the procedure described in Part A of Example 47 above. Instead of RF sealing, nominally 3 mm wide strips of non-conductive double sided fletching tape were applied across the metallized substrate at the junctions, and aligned with in order to bond the core to the top shrink film. Similarly, strips of Thor Labs TCDT1 conductive double sided tape strips were applied to the bottom surface of the core (aligned with the bottom thermoelectric junctions to adhere the bottom surface of the non-shrinkable core to the lower shrinkable film layer. Bond lines were staggered by Po/2 relative to each other. Thermoelectric performance was otherwise similar to that described in Example 47 3.

Example 49

Thermoelectric Module Using Spray Painting

The thermoelectric pattern in this example was produced by spray painting nickel and silver using masks as described previously. The thermoelectric metals were both in the form of aerosol spray paint cans (each supplied by MG Super Shield™, MG Chemicals, Burlington Calif.). The mask was produced by laser cutting Grafix™ "frisket" film used for air brush stenciling. Each element was 5 mm wide and 10 mm long with approximately 1 mm overlap between junctions to ensure continuity. There were 14 rows total with 10 junction pairs per row resulting in 140 junction pairs total. The ends of each row were interconnected by silver connectors that were designed into one of the masks.

The non-shrinkable core was biaxially oriented PET (Hewlett Packard overhead transparency film). This transparency film was designed for use with inkjet printers and so coating was applied to the treated side to ensure good adhesion of the ink. To create the thermoelectric pattern, the first mask was applied to the transparency film and the nickel paint sprayed onto the surface. The film was allowed to dry for approximately 2 minutes at which point the mask was peeled off. The nickel was then allowed to completely dry for 24 hours before repeating the process with the other mask using the silver paint.

Upon drying, the sample was then bonded to create an A/B/C/B/A structure with layer C as a non-shrinkable substrate with a thermoelectric pattern formed thereon as described in the above paragraph and films A and B selected as described in Example 47 Part B. The sample was then corrugated by placing in a hot air oven for 15 minutes at 67° C. The final corrugated module was 11 cm×21 cm and 4 mm thick. It had a nominal internal resistance of 620 ohms.

To test for thermoelectric generation, the sample was placed between two aluminum plates (used as heatsinks) which were in turn placed on a hotplate set at very low setting. Thermocouple wires were placed between the plates and the thermoelectric module to determine the total temperature drop. For a net $\Delta T=34°$ C. (i.e. 70° C. on hot side and 36° C. on cold side, the module produced a voltage of 7.5 mV. Silver has a Seebeck coefficient of 1.5 uV/K whereas nickel's is −19.5 uV/K resulting in $S_{AB}=21$ uV/K. For 140 junctions, the theoretical voltage for $\Delta T=34°$ C. is 100 mV, which is well above the experimental value. However, silver and nickel have very high thermal conductivities and therefore cause the effective $\Delta T$ across the junctions to be much lower. This illustrates why thermoelectric materials with high Seebeck coefficient but low thermal conductivity can be so valuable.

Example 50

Thermoelectric Pattern with Junctions on Opposing Faces of Corrugated Structure

In this example, a thermoelectric module was created with a thermoelectric pattern similar to that depicted in FIG. 10, with the alternating elements connecting at junctions located on opposing adjacent faces of the top surface of the non-shrinkable core. Junctions were created via the same procedure and materials as in Example 49 except the mask was modified to create junction patterns on the sides of the corrugation peaks. Each junction was nominally 2 mm wide, 13 mm tall, and the period spacing for a junction pair was 12 mm. There were 12 junction pairs in a given row, with 8 rows in total (i.e. 4 corrugation sine waves with a row on each side of the sine wave) resulting in 96 total junctions. The final total height of the corrugated module was 5.7 mm with the thermoelectric junctions aligned at about a 45 degree angle to the horizontal.

For electrical testing, the module rows were interconnected using double sided conductive tape from 3M, and alligator clips. Each of two rows were connected in parallel using the conductive tape, resulting in 4 "effective" rows. These 4 sets of effective rows were then connected in series to produce 48 effective total junctions. The DC resistance of this series arrangement was nominally 1020 ohms. The sample was then mounted on a hot plate and dc voltage measured. For a hot side temperature of 70° C., and an air side temperature of 30° C. (net $\Delta T=40°$ C.), the total voltage was measured to be 3.6 mV.

That which is claimed is:

1. A self-corrugating laminate useful in the manufacture of thermoelectric devices said laminate comprising an upper and a lower shrinkable film layer each having an axis of shrinkage and a non-shrinkable core having a top surface and a bottom surface and bonded between said upper and lower shrinkable film layers along bond lines, wherein the bond lines that bond the upper shrinkable film layer to said top surface of said non-shrinkable core are staggered relative to the bond lines that bond said lower shrinkable film layer to said bottom surface of said non-shrinkable core such that upon shrinkage of said shrinkable film layers, structural corrugations are formed in said non-shrinkable core,
wherein at least a portion of the bond lines are arranged substantially perpendicular to an axis of shrinkage of the shrinkable film layer to which the bond lines are attached, and
wherein said non-shrinkable core further includes a thermoelectric pattern on at least one surface thereof.

2. The self-corrugating laminate of claim 1 wherein said shrinkable film layers exhibit a percent shrinkage along said axis of shrinkage of from about 10 to about 45 percent.

3. The self-corrugating laminate of claim 1 wherein said nonshrinkable core comprises multiple layers of non-shrinkable film.

4. The self-corrugating laminate of claim 1 wherein said thermoelectric pattern comprises a series of adjacent alternating electrically conductive or semiconductive thermoelectric elements of differing electrical conductivity connected at junctions.

5. The self-corrugating laminate of claim 4 wherein said junctions include overlapping edges of said alternating elements.

6. The self-corrugating laminate of claim 4 wherein said junctions include conductive deposits.

7. The self-corrugating laminate of claim 1 wherein at least one of the shrinkable film layers further includes a thermally conductive layer.

8. A corrugated structure, useful as a thermoelectric device, formed from the self-corrugating laminate of claim 1.

9. A method for forming a thermoelectric device comprising
(i) procuring a self-corrugating laminate, said according to claim 1; and
(ii) subjecting said self-corrugating laminate to conditions sufficient to impart corrugation to said non-shrinkable core of said self-corrugating laminate.

10. The method of claim 9 wherein the subjecting step includes exposing said shrinkable film layers of said self-corrugating laminate to a temperature laminate to a temperature sufficient to cause shrinkage thereof.

11. The method of claim 10 wherein said temperature is above the shrinkage temperature of both of said shrinkable film layers.

12. The method of claim 11 does not exceed the softening temperature of the materials from which said non-shrinkable core is formed.

* * * * *